(12) United States Patent
Kim et al.

(10) Patent No.: US 11,805,666 B2
(45) Date of Patent: Oct. 31, 2023

(54) DISPLAY DEVICE

(71) Applicant: SAMSUNG DISPLAY CO., LTD., Yongin-si (KR)

(72) Inventors: Yohan Kim, Seoul (KR); Eung Seok Park, Seoul (KR); Wonmin Yun, Yongin-si (KR); Yongtack Kim, Yongin-si (KR); Byoungduk Lee, Seongnam-si (KR); Yoonhyeung Cho, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 113 days.

(21) Appl. No.: 17/194,893

(22) Filed: Mar. 8, 2021

(65) Prior Publication Data

US 2021/0384461 A1    Dec. 9, 2021

(30) Foreign Application Priority Data

Jun. 4, 2020    (KR) ........................ 10-2020-0067810

(51) Int. Cl.
| | |
|---|---|
| *H10K 50/842* | (2023.01) |
| *H10K 50/844* | (2023.01) |
| *H10K 59/38* | (2023.01) |
| *H10K 59/40* | (2023.01) |
| *H10K 59/88* | (2023.01) |

(Continued)

(52) U.S. Cl.
CPC ....... *H10K 50/8426* (2023.02); *H10K 50/844* (2023.02); *H10K 50/8428* (2023.02); *H10K 59/122* (2023.02); *H10K 59/131* (2023.02); *H10K 59/38* (2023.02); *H10K 59/40* (2023.02);

(Continued)

(58) Field of Classification Search
CPC ............. H10K 50/8426; H10K 50/844; H10K 50/8428; H10K 59/88; H10K 59/40; H10K 59/38; H10K 59/131; H10K 59/126; H10K 59/122
See application file for complete search history.

(56) References Cited

U.S. PATENT DOCUMENTS

| | | |
|---|---|---|
| 9,298,057 B2 | 3/2016 | Hosaka et al. |
| 9,722,203 B2 | 8/2017 | Nagata |

(Continued)

FOREIGN PATENT DOCUMENTS

| | | |
|---|---|---|
| JP | 6348012 | 6/2018 |
| JP | 6474337 | 2/2019 |

(Continued)

*Primary Examiner* — Vongsavanh Sengdara
(74) *Attorney, Agent, or Firm* — F. CHAU & ASSOCIATES, LLC

(57) ABSTRACT

Provided is a display device including a first substrate including a display part and a non-display part around the display part, a second substrate disposed on the first substrate, a pixel disposed between the display part and the second substrate, a quantum dot layer disposed between the second substrate and the pixel, a bank layer disposed around the quantum dot layer, and when viewed on a plane, overlapping the non-display part, a color filter disposed between the second substrate and the quantum dot layer, a dummy color filter, when viewed on the plane, overlapping the non-display part, and disposed between the bank layer and the second substrate, and a sealant disposed between the non-display part and the bank layer.

20 Claims, 13 Drawing Sheets

(51) Int. Cl.
   *H10K 59/122*   (2023.01)
   *H10K 59/131*   (2023.01)
   *G06F 3/041*   (2006.01)
   *H10K 102/00*   (2023.01)

(52) U.S. Cl.
   CPC ............ *H10K 59/88* (2023.02); *G06F 3/041* (2013.01); *H10K 2102/331* (2023.02)

(56) References Cited

U.S. PATENT DOCUMENTS

| | | | |
|---|---|---|---|
| 10,115,774 | B2 | 10/2018 | Kuriyagawa et al. |
| 10,431,644 | B2 | 10/2019 | Kim et al. |
| 2017/0192295 | A1* | 7/2017 | Kim .................. G02F 1/133606 |
| 2019/0018273 | A1* | 1/2019 | Park .................... C09B 29/3673 |
| 2019/0064602 | A1* | 2/2019 | Kim .................. G02F 1/133617 |
| 2019/0131350 | A1* | 5/2019 | Kwak .................... H10K 59/35 |
| 2019/0131351 | A1* | 5/2019 | Park ...................... H10K 59/12 |
| 2019/0198573 | A1* | 6/2019 | Kim ........................ H10K 50/86 |
| 2019/0204498 | A1 | 7/2019 | Lee et al. |
| 2019/0206324 | A1* | 7/2019 | Kim ...................... G09G 3/3241 |
| 2019/0206333 | A1* | 7/2019 | Kim ...................... H10K 59/129 |
| 2020/0073162 | A1* | 3/2020 | Shin ................. G02F 1/133504 |
| 2020/0152705 | A1 | 5/2020 | Son et al. |
| 2020/0161579 | A1 | 5/2020 | Kim et al. |
| 2020/0258946 | A1 | 8/2020 | Kim et al. |

FOREIGN PATENT DOCUMENTS

| | | |
|---|---|---|
| KR | 10-2015-0012203 | 2/2015 |
| KR | 10-2019-0002757 | 1/2019 |
| KR | 10-2019-0083384 | 7/2019 |
| KR | 10-2020-0024979 | 3/2020 |

\* cited by examiner

DISPLAY DEVICE

CROSS-REFERENCE TO RELATED APPLICATIONS

This U.S. non-provisional patent application claims priority under 35 U.S.C. § 119 to Korean Patent Application No. 10-2020-0067810, filed on Jun. 4, 2020, in the Korean Intellectual Property Office, the entire contents of which are incorporated by reference herein.

TECHNICAL FIELD

The present inventive concept relates to a display device.

DISCUSSION OF RELATED ART

In general, a display device includes a plurality of pixels for displaying an image. Each of the pixels includes an image display element and a driving element connected to the image display element. The driving element drives the image display element, and the image display element generates predetermined light, so that an image is provided to a user.

Recently, to enhance color purity, a display device including a light conversion layer has been developed. The light conversion layer is disposed on the pixels, and converts light generated from the image display element of each of the pixels into light having a different wavelength. The light conversion layer includes quantum dot layers corresponding to the pixels. Each of the quantum dot layers includes quantum dots for converting the wavelength of light.

The pixels are disposed on a first substrate, and the quantum dot layers are disposed on a second substrate. The pixels and the quantum dot layers are disposed between the first substrate and the second substrate so as to face each other. The first substrate and the second substrate are bonded by a sealant, and thus, the pixels and the quantum dot layers are sealed by the sealant. The sealant is usually disposed at a peripheral area of the second substrate where a plurality of layers formed on the second substrate are ended, and due to the pressure applied to the second substrate, defective bonding of the first substrate and the second substrate by the sealant may occur.

SUMMARY

The present inventive concept provides a display device capable of reducing the difference in gap between a first substrate and a second substrate.

According to an exemplary embodiment of the present inventive concept, a display device includes a first substrate including a display part and a non-display part around the display part, a second substrate disposed on the first substrate, a pixel disposed between the display part and the second substrate, a quantum dot layer disposed between the second substrate and the pixel, a bank layer disposed around the quantum dot layer, and when viewed on a plane, overlapping the non-display part, a color filter disposed between the second substrate and the quantum dot layer, a dummy color filter, when viewed on the plane, overlapping the non-display part, and disposed between the bank layer and the second substrate, and a sealant disposed between the non-display part and the bank layer.

According to an exemplary embodiment of the present inventive concept, a display device includes a display part and a non-display part around the display part, a second substrate disposed on the first substrate, a pixel disposed between the display part and the second substrate, a quantum dot layer disposed between the second substrate and the pixel, a bank layer disposed around the quantum dot layer, and when viewed on a plane, overlapping the non-display part, a support layer disposed on the non-display part, a dam disposed on the non-display part and spaced apart from the support layer, and a sealant disposed between the non-display part and the bank layer, in which the sealant may be disposed between the support layer and the dam.

According to an exemplary embodiment of the present inventive concept, a display device includes a first substrate including a display part and a non-display part around the display part, a second substrate disposed on the first substrate, a pixel disposed between the display part and the second substrate, a quantum dot layer disposed between the second substrate and the pixel, a color filter disposed between the second substrate and the quantum dot layer, a bank layer disposed around the quantum dot layer, and when viewed on a plane, overlapping the non-display part, a dummy color filter, when viewed on the plane, overlapping the non-display part, and disposed between the bank layer and the second substrate, a support layer disposed on the non-display part, a thin film encapsulation layer disposed on the display part to cover the pixel and extending to the non-display part to cover the support layer, and a sealant disposed between the thin film encapsulation layer and the bank layer, in which the sealant may be disposed between the support layer and the display part, and an edge of the thin film encapsulation layer adjacent to and spaced apart from an edge of the first substrate may be disposed between the edge of the first substrate and the support layer.

BRIEF DESCRIPTION OF THE DRAWINGS

The accompanying drawings are included to provide a further understanding of the present inventive concept, and are incorporated in and constitute a part of this application. The drawings illustrate exemplary embodiments of the present inventive concept and, together with the description, serve to explain principles of the present inventive concept. In the drawings.

Figure 1:
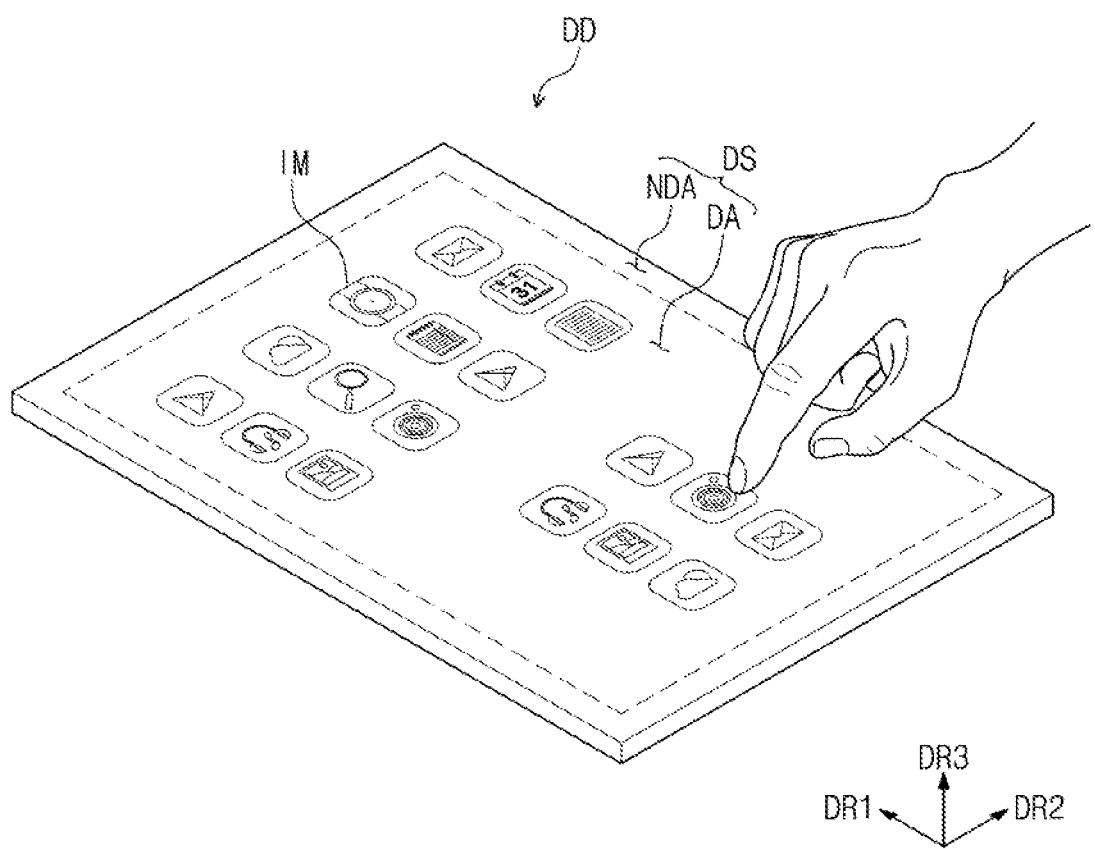
FIG. 1 is a perspective view of a display device according to an exemplary embodiment of the present inventive concept.

Since the drawings in FIGS. 1-14 are intended for illustrative purposes, the elements in the drawings are not necessarily drawn to scale. For example, some of the elements may be enlarged or exaggerated for clarity purpose.

DETAILED DESCRIPTION OF THE EMBODIMENTS

In the present inventive concept, when an element (or a region, a layer, a portion, etc.) is referred to as being "on", "connected to" or "coupled to" another element, it means that the element may be directly disposed on/connected to/coupled to the other element, or that a third element may be disposed therebetween.

Like reference numerals refer to like elements.

The term "and/or" includes any and all combinations of one or more of which associated configurations may define.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present inventive concept. The terms of a singular form may include plural forms unless the context clearly indicates otherwise.

In addition, terms such as "below", "lower", "above", "upper" and the like are used to describe the relationship of the configurations shown in the drawings. The terms are used as a relative concept and are described with reference to the direction indicated in the drawings. These relative terms are intended to encompass different orientations of the device in use or operation, in addition to the orientation depicted in the drawings.

Unless otherwise defined, all terms (including technical and scientific terms) used herein have the same meaning as commonly understood by one of ordinary skill in the art to which the present inventive concept pertains. It is also to be understood that terms defined in commonly used dictionaries should be interpreted as having meanings consistent with the meanings in the context of the related art, and should not be interpreted in an ideal or overly formal sense, unless explicitly defined herein.

It should be understood that the terms "comprise", or "have" are intended to specify the presence of stated features, integers, steps, operations, elements, components, or combinations thereof in the present inventive concept, but do not preclude the presence or addition of one or more other features, integers, steps, operations, elements, components, or combinations thereof.

Hereinafter, exemplary embodiments of the present inventive concept will be described in detail with reference to the accompanying drawings.

FIG. 1 is a perspective view of a display device according to an exemplary embodiment of the present inventive concept.

Referring to FIG. 1, a display device DD according to an exemplary embodiment of the present inventive concept may have a rectangular shape which has long sides extending in a first direction DR1 and short sides extending in a second direction DR2 which crosses the first direction DR1. In addition, the display device DD may approximately have a quadrangular shape, and its four corner portions may have a round shape having a predetermined curvature. However, the present inventive concept is not limited thereto. The display device DD may have various shapes such as, for example, a circular shape or a polygonal shape.

Hereinafter, a direction substantially perpendicularly crossing a plane defined by the first direction DR1 and the second direction DR2 is defined as a third direction DR3. In addition, in the present inventive concept, "when viewed on a plane" is defined as being in the state of being viewed from the third direction DR3.

The top surface of the display device DD may be defined as a display surface DS, and may have a plane defined by the first direction DR1 and the second direction DR2. Images IM generated in the display device DD may be provided to a user through the display surface DS. The display surface DS may be a flat surface. However, the present inventive concept is not limited thereto. For example, the display surface DS may be a curved surface or a three-dimensional surface. The three-dimensional display surface, in which images are generated within a display volume rather than upon a stationary surface, may include a plurality of display areas, for example, a polyprism surface. The plurality of display areas may be oriented in different directions.

The display surface DS may include a display part DA and a non-display part NDA around the display part DA. The display part DA displays an image, and the non-display part NDA may not display an image. The non-display part NDA surrounds the display part DA, and may define an edge of the display device DD printed in a predetermined color.

The display device DD may be used for, for example, a television, a monitor, or a large electronic device such as an external advertisement board. Also, the display device DD may be used for a small-and-medium-sized electronic device such as, for example, a personal computer, a notebook computer, a personal digital terminal, a car navigation system, a game machine, a smart phone, a tablet, a smart watch, or a camera. However, these are merely exemplary embodiments, and the display device DD may be used for other electronic devices as long as it does not depart from the scope of the present inventive concept.

Figure 2:
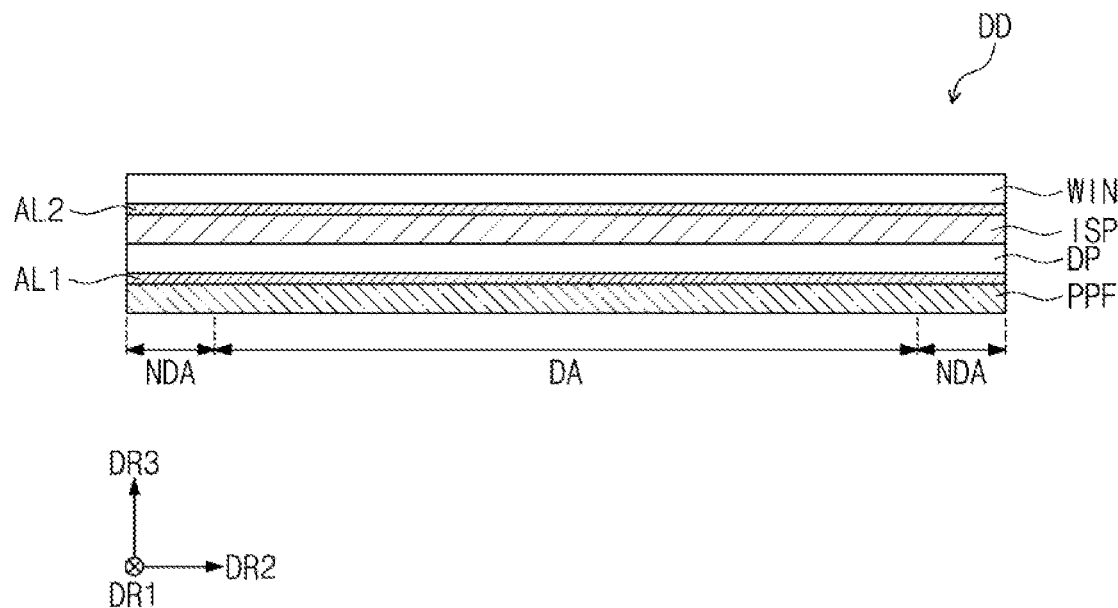
FIG. 2 is a view exemplarily illustrating a cross-section of the display device illustrated in FIG. 1.

FIG. 2 is a view exemplarily illustrating a cross-section of the display device illustrated in FIG. 1.

Illustratively, FIG. 2 illustrates a cross-section of the display device DD viewed from the first direction DR1.

Referring to FIG. 2, the display device DD may include a display panel DP, an input sensing unit ISP, a window WIN, a panel protective film PPF, and first and second adhesive layers AL1 and AL2. The first and second adhesive layers AL1 and AL2 may be formed from a pre-coated film or from a liquid paste. In general, first and second adhesive layers AL1 and AL2 may have optical clarity and may provide shock resistance. The display panel DP may be a flexible display panel. For example, the display panel DP may include a plurality of electronic elements disposed on a flexible substrate that is bendable, foldable, or rollable. However, the present inventive concept is not limited thereto. For example, the display panel DP may be a rigid type.

The display panel DP according to an exemplary embodiment of the present inventive concept may be a light emitting-type display panel. For example, the display panel DP may be an organic light emitting display panel or a quantum dot light emitting display panel. A light emitting layer of an organic light emitting display panel may include an organic light emitting material. A light emitting layer of a quantum dot light emitting display panel may include quantum dots, quantum rods, and the like. The quantum dots and the quantum rods may be small semiconductor particles which are several nanometers in size. Hereinafter, the display panel DP will be described as an organic light emitting display panel.

The input sensing unit ISP may be disposed on the display panel DP, and may include a plurality of sensors for sensing an external input in a capacitive manner. Alternatively, the plurality of sensors of the input sensing unit ISP may sense an external input by using an electromagnetic induction method or a pressure sensing method. The input sensing unit ISP may further include a plurality of signal lines connected to the plurality of sensors, and at least one insulating layer. The input sensing unit ISP may be manufactured directly on the display panel DP when manufacturing the display device DD. However, the present inventive concept is not limited thereto. For example, the input sensing unit ISP may be manufactured as a separate panel from the display panel DP, and then attached to the display panel DP by an adhesive layer. Alternatively, the input sensing unit ISP may be omitted.

The window WIN may be disposed on the input sensing unit ISP, and may protect the display panel DP and input sensing unit ISP from an external scratch and impact. The window WIN may be formed of an insulating material such as, for example, glass, quartz, and/or a polymer resin.

The panel protective film PPF may be disposed below the display panel DP, may protect a lower portion of the display panel DP, and may support the display panel DP. The panel protective film PPF may include a flexible plastic material such as polyethyleneterephthalate (PET) or polyimide (PI).

The first adhesive layer AL1 is disposed between the display panel DP and the panel protective film PPF to bond the display panel DP and the panel protective film PPF together. The second adhesive layer AL2 is disposed between the window WIN and the input sensing unit ISP to bond the window WIN and the input sensing unit ISP together.

Figure 3:
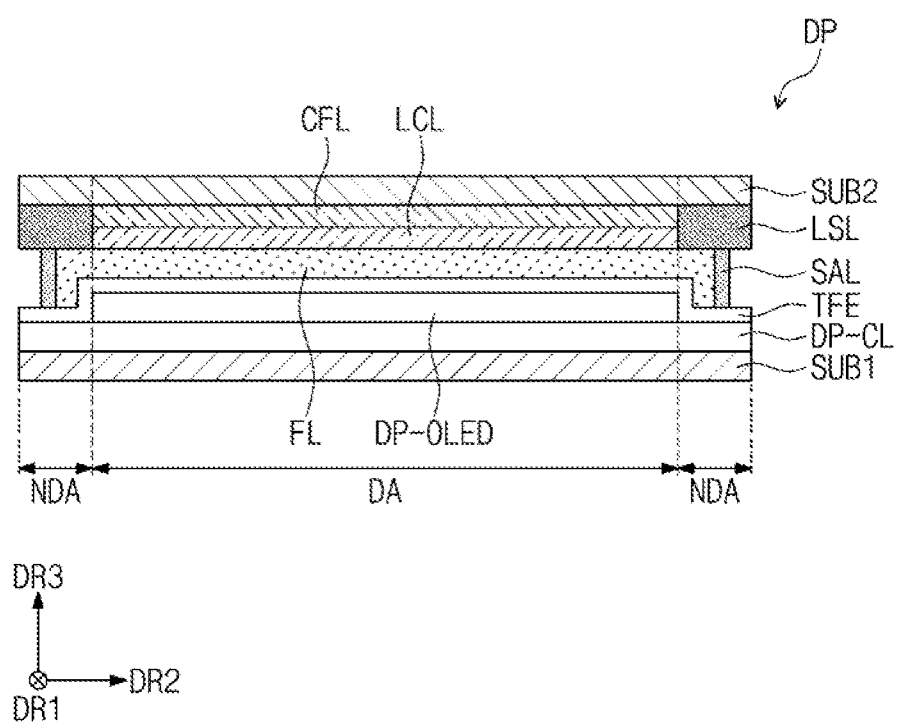
FIG. 3 is a view exemplarily illustrating a cross-section of a display panel illustrated in FIG. 2.

FIG. 3 is a view exemplarily illustrating a cross-section of a display panel illustrated in FIG. 2.

Illustratively, FIG. 3 illustrates a cross-section of the display panel DP viewed from the first direction DR1.

Referring to FIG. 3, the display panel DP may include a first substrate SUB1, a second substrate SUB2, a circuit element layer DP-CL, a display element layer DP-OLED, a thin film encapsulation layer TFE, a color filter layer CFL, a light conversion layer LCL, a light blocking layer LSL, a filling agent FL, and a sealant SAL.

The second substrate SUB2 may be disposed on the first substrate SUB1 to face the first substrate SUB1. The circuit element layer DP-CL, the display element layer DP-OLED, the thin film encapsulation layer TFE, the color filter layer CFL, the light conversion layer LCL, the light blocking layer LSL, the filling agent FL, and the sealant SAL may be disposed between the first substrate SUB1 and the second substrate SUB2.

The first substrate SUB1 and the second substrate SUB2 may include a flexible plastic material such as polyimide (PI) or glass. When viewed on a plane, the first substrate SUB1 may include the display part DA and the non-display part NDA around the display part DA. The display part DA may be an area in which the pixels are arranged. The non-display part NDA may be an area in which the pixels are not arranged, however, signal lines and drivers for supporting an operation of the pixels may be arranged. Each of the pixels may include a light emitting element, e.g., an organic light emitting diode OLED to be described.

The circuit element layer DP-CL may be disposed on the first substrate SUB1. The display element layer DP-OLED may be disposed on the circuit element layer DP-CL. In addition, the display element layer DP-OLED may be disposed on the display part DA.

A plurality of pixels may be disposed in the circuit element layer DP-CL and the display element layer DP-OLED. Each of the pixels may include a transistor disposed in the circuit element layer DP-CL and a light emitting element disposed in the display element layer DP-OLED to be connected to the transistor. The configuration of a pixel will be described in detail below. The display element layer DP-OLED may include at least the organic light emitting diodes OLED as the light emitting elements, and may further include an organic layer such as a pixel definition film PDL to be described. The circuit element layer DP-CL may include at least one insulating layer and at least a circuit element. The insulating layer includes at least one inorganic layer and at least one organic layer. The circuit element includes signal lines and a driving circuit of the pixels.

The thin film encapsulation layer TFE may be disposed on the circuit element layer DP-CL to cover the display element layer DP-OLED, and may protect the pixels from moisture, oxygen, and a foreign material. The thin-film encapsulation layer TFE may include at least one organic encapsulation layer and at least one inorganic encapsulation layer. In an exemplary embodiment of the present inventive concept, the number of organic encapsulation layers and the number of inorganic encapsulation layers and an order of stacking organic encapsulation layers and inorganic encapsulation layers may be variously changed.

The color filter layer CFL may be disposed below the second substrate SUB2. When viewed on a plane, the color filter layer CFL may overlap the display part DA. The light conversion layer LCL may be disposed below the color filter layer CFL. The light conversion layer LCL may overlap the display part DA when viewed on a plane.

The light blocking layer LSL may be disposed below the second substrate SUB2, and may overlap the non-display part NDA when viewed on a plane. The light blocking layer LSL may be disposed around the color filter layer CFL and the light conversion layer LCL. For example, the light blocking layer LSL may surround the color filter layer CFL and the light conversion layer LCL when viewed on a plane. The color filter layer CFL according to an exemplary embodiment of the present inventive concept may include a plurality of color filters. The color filters may have a predetermined arrangement. The arrangement of the color filters may be determined by taking into account emission colors of pixels included in the display panel DP. Thus, the desired color may be realized by filtering the light emitted by each of the pixels with the color filter.

The sealant SAL may overlap the non-display part NDA, and may be disposed between the first substrate SUB1 and the second substrate SUB2. The first substrate SUB1 and the second substrate SUB2 may be bonded to each other by the sealant SAL. The sealant SAL may be disposed between the thin film encapsulation layer TFE and the light blocking layer LSL, and may include an ultraviolet (UV) curable material. For example, the sealant SAL may include a heat curable resin or a photocurable resin. Alternatively, in an exemplary embodiment of the present inventive concept, the sealant SAL may include an inorganic material, for example, frit, and the frit may include a crystalized (fully and/or partially crystallized) base or mother glass.

In an exemplary embodiment of the present inventive concept, the sealant SAL may contain an epoxy resin including, for example, a bisphenol A epoxy resin, a bisphenol F epoxy resin, an aromatic epoxy resin, a hydrogenated bisphenol epoxy resin, a cycloaliphatic epoxy resin, a novolac epoxy resin, a dicyclopentadiene epoxy resin, or any combination thereof. However, the present inventive concept is not limited thereto, and any other suitable heat-curable or photocurable resin may be used for the sealant SAL.

The sealant may further include one or more of, for example, a heat curing agent, a photoinitiator, a coupling agent, a curing accelerator, an inorganic filler, an antioxidant, and a spacer.

The filling agent FL may overlap the display part DA, and may be disposed between the light conversion layer LCL and the thin film encapsulation layer TFE. The filling agent FL may extend toward the non-display part NDA to come into contact with the sealant SAL. The filling agent FL may include, for example, silicone, epoxy, and/or acrylic based thermosetting materials. For example, the first substrate SUB1 and the second substrate SUB2 may be assembled together by the sealant SAL located on the non-display part NDA surrounding the display part DA, and also by the filling agent FL filling a space inside the sealant SAL. For example, the filling agent FL may fill the space surrounded by the sealant SAL.

Light generated in the display element layer DP-OLED may be provided to the light conversion layer LCL. The light conversion layer LCL may convert the color of the light provided from the display element layer DP-OLED. The light whose color has been converted by the light conversion layer LCL may be emitted to the outside through the color filter layer CFL and the second substrate SUB2.

The color filter layer CFL may prevent the reflection of external light provided to the display panel DP from the outside. Such a function of the color filter layer CFL will be described in detail below. The color filter layer CFL may include different color filters each selectively transmitting lights within a specified wavelength range and blocking lights outside that wavelength range. The light blocking layer LSL may block light in the non-display part NDA.

Figure 4:
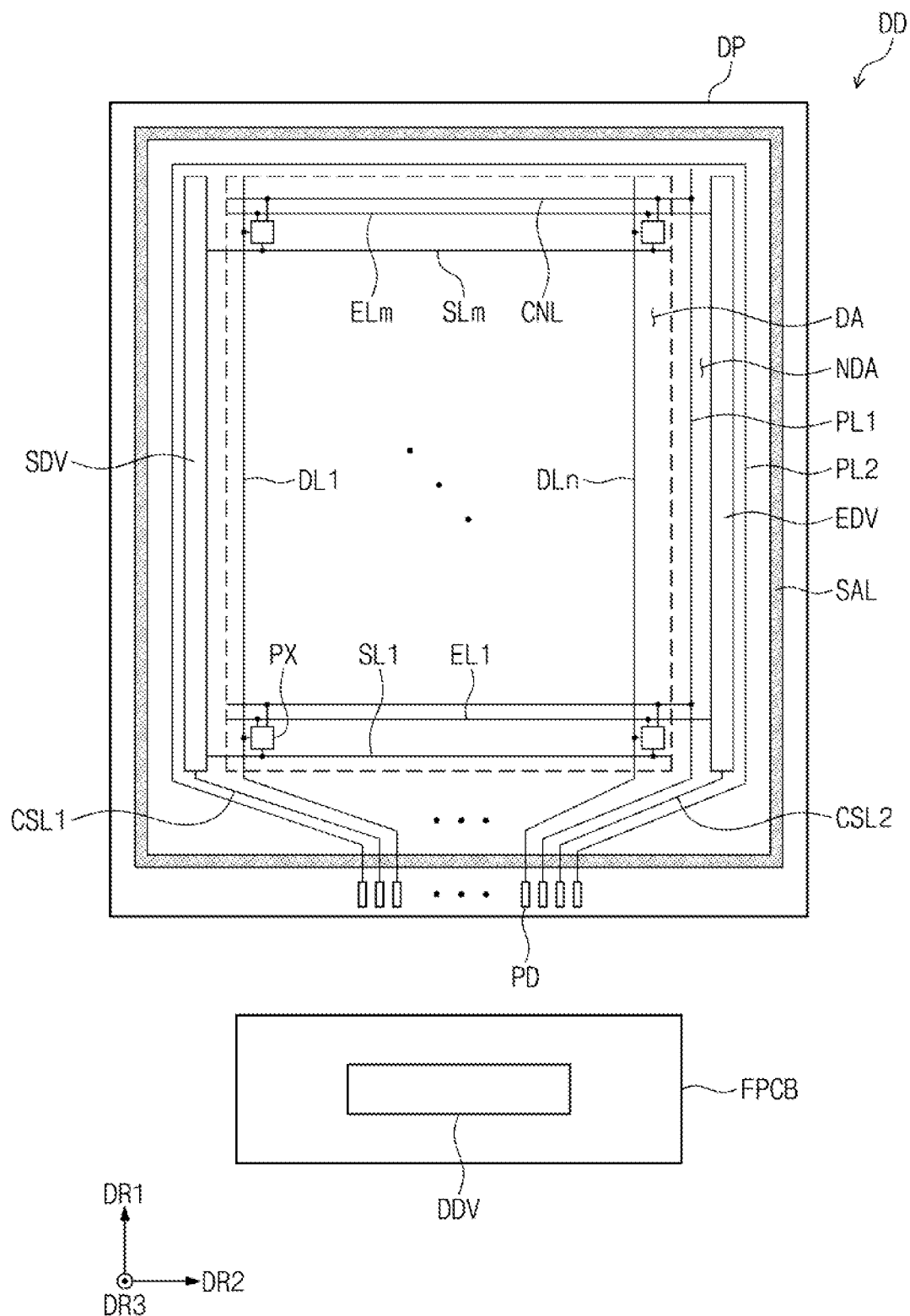
FIG. 4 is a plan view of the display panel illustrated in FIG. 3.

FIG. 4 is a plan view of the display panel DP illustrated in FIG. 3.

Referring to FIG. 4, the display device DD may include the display panel DP, a scan driver SDV, a data driver DDV, a light emission driver EDV, and a plurality of pads PD.

The display panel DP may have a rectangular shape which has long sides extending in the first direction DR1 and short sides extending in the second direction DR2, but the shape of the display panel DP is not limited thereto. The display panel DP may include the display part DA and the non-display part NDA surrounding the display part DA.

The display panel DP may include a plurality of pixels PX, a plurality of scan lines SL1 to SLm, a plurality of data lines DL1 to DLn, a plurality of light emission lines EL1 to ELm, first to second control lines CSL1 and CSL2, first and second power lines PL1 and PL2, and connection lines CNL. In the reference characters above, m and n are natural numbers.

The pixels PX may be disposed in the display part DA. The scan driver SDV and the light emission driver EDV may be disposed in the non-display part NDA which is adjacent to each of the long sides of the display panel DP. For example, when viewed on a plane, the scan driver SDV may be located opposite to the light emission driver EDV with the display part DA interposed therebetween, and may be substantially parallel to the light emission driver EDV.

The data driver DDV may be mounted on a flexible printed circuit board FPCB. The flexible printed circuit board FPCB may be connected to the non-display part NDA which is adjacent to any one short side of the short sides of the display panel DP. When viewed on a plane, the flexible printed circuit board FPCB may be connected to a lower end of the display panel DP. The data driver DDV may be connected to the display panel DP through the flexible printed circuit board FPCB. However, the present inventive concept is not limited thereto. For example, the data driver DDV may be disposed directly on the non-display part NDA.

The scan lines SL1 to SLm may be extended in the second direction DR2 to connect to the scan driver SDV. The data lines DL1 to DLn may be extended in the first direction DR1 to connect to the pixels PX. The data lines DL1 to DLn may be connected to the data driver DDV through the flexible printed circuit board FPCB. The light emission lines EL1 to ELm may be extended in the second direction DR2 to connect to the pixels PX and light emission driver EDV.

A first power line PL1 may be extended in the first direction DR1, and may be disposed in the non-display part NDA. The first power line PL1 may be disposed between the display part DA and the light emission driver EDV, but the present inventive concept is not limited thereto. For example, the first power line PL1 may be disposed between the display part DA and the scan driver SDV.

The connection lines CNL may be extended in the second direction DR2 and may be arranged in the first direction DR1. The connection lines CNL may be connected to the first power line PL1 and the pixels PX. A first voltage may be applied to the pixels PX through the first power line PL1 and the connection lines CNL which are connected to each other.

A second power line PL2 may be disposed in the non-display part NDA, and may extend along the long sides of the display panel DP and another short side of the display panel DP to which the data driver DDV is not connected. For example, the second power line PL2 may partially surround the display part DA, and may extend along all sides of the display panel DP excluding one side of the display panel DP that neighbors the flexible printed circuit board FPCB and is connected to the data driver DDV. The second power line PL2 may be disposed at an outer periphery than the scan driver SDV and the light emission driver EDV.

The second power line PL2 may extend toward the display part DA to connect to the pixels PX. A second voltage having a lower level than the first voltage may be applied to the pixels PX through the second power line PL2.

A first control line CSL1 is connected to the scan driver SDV, and when viewed on a plane, may extend toward a lower end of the display panel DP. A second control line CSL2 is connected to the light emission driver EDV, and when viewed on a plane, may extend toward the lower end of the display panel DP.

The pads PD may be disposed on the display panel DP. The pads PD may be adjacent to the lower end of the display panel DP. The data lines DL1 to DLn, the first power line PL1, the second power line PL2, the first control line CSL1, and the second control line CSL2 may be connected to the pads PD. On the flexible printed circuit board FPCB, a plurality of connection pads may be disposed to be connected to the pads PD.

The pads PD connected to the data lines DL1 to DLn may be connected to the data driver DDV through the flexible printed circuit board FPCB. The display device DD may include a timing controller for controlling the operation of the scan driver SDV, the data driver DDV, and the light emission driver EDV and a voltage generation unit for generating the first and second voltages. In an exemplary embodiment of the present inventive concept, the flexible printed circuit board FPCB may be electrically connected to the pads PD located at a side adjacent to the lower end of the display panel DP in the non-display part NDA. The flexible printed circuit board FPCB may be bent and electrically connected to the display panel DP. Accordingly, the flexible printed circuit board FPCB functioning as a controller may output a signal to the display panel DP or receive a signal from the display panel DP through the pads PD.

The timing controller and the voltage generation unit may be disposed on a printed circuit board, and may be connected to the flexible printed circuit board FPCB through the printed circuit board. The timing controller may be connected to the data driver DDV through the printed circuit board and the flexible printed circuit board FPCB. The first and second power lines PL1 and PL2 and the first and second control lines CSL1 and CSL2 may be connected to the timing controller and the voltage generation unit through the flexible printed circuit board FPCB and the printed circuit board. For example, the timing controller and the voltage generation unit may respectively output a signal and a voltage to the first and second control lines CSL1 and CSL2, and the first and second power lines PL1 and PL2 through the pads PD.

The sealant SAL may be disposed in the non-display part NDA to surround the display part DA, and may be adjacent to an edge of the display panel DP. Illustratively, the sealant SAL is disposed at an outer periphery than the second power line PL2, and may be disposed at an inner periphery than the pads PD.

The scan driver SDV generates a plurality of scan signals, and the scan signals may be applied to the pixels PX through the scan lines SL1 to SLm. The data driver DDV generates a plurality of data voltages, and the data voltages may be applied to the pixels PX through the data lines DL1 to DLn. The light emission driver EDV generates a plurality of light emission signals, and the light emission signals may be applied to the pixels PX through the light emission lines EL1 to ELm. For example, the data driver DDV may receive a vertical synchronization signal, a horizontal synchronization signal, and a clock signal, generate control signals for controlling driving of the scan driver SDV and the light emission driver EDV, and transfer the relevant control signals to the relevant elements.

The pixels PX may be provided with the data voltages in response to the scan signals, and may display an image by emitting light of luminance corresponding to the data voltages in response to the light emission signals. The light emission duration of the pixels PX may be controlled by the light emission signals.

Figure 5:
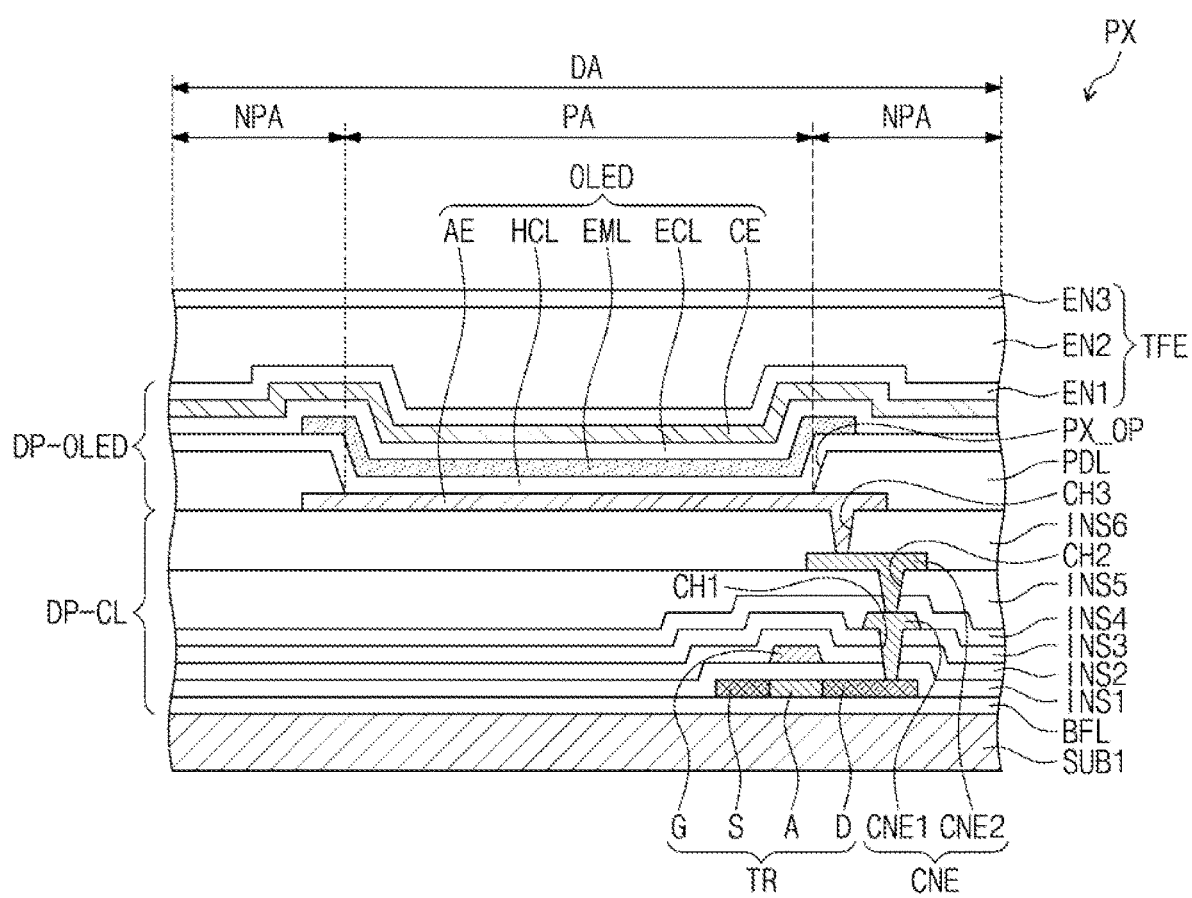
FIG. 5 is a view exemplarily illustrating a cross-section of one pixel illustrated in FIG. 4.

FIG. 5 is a view exemplarily illustrating a cross-section of one pixel illustrated in FIG. 4.

Referring to FIG. 5, a pixel PX may include a transistor TR and a light emitting element OLED (i.e., the organic light emitting diode). The light emitting element OLED may include a first electrode AE, a hole control layer HCL, a light emitting layer EML, an electron control layer ECL, and a second electrode CE. The first electrode AE may be an anode electrode, and the second electrode CE may be a cathode electrode.

The transistor TR and the light emitting element OLED may be disposed on the first substrate SUB1. Illustratively, one transistor TR is illustrated, but substantially, the pixel PX may include a plurality of transistors for driving the light emitting element OLED and at least one capacitor. In an exemplary embodiment of the present inventive concept, the driving circuit of the pixel included in the circuit element layer DP-CL may include at least two transistors TR and at least one capacitor. The number of transistors TR and the number of capacitors may be changed in various ways according to a design of the driving circuit of the pixel. For example, the driving circuit of the pixel may include two, three, four, five, six, seven or more transistors TR.

The display part DA may include a light emitting region PA corresponding to each of the pixels PX and a non-light emitting region NPA around the light emitting region PA. The light emitting element OLED may be disposed in the light emitting region PA.

On the first substrate SUB1, a buffer layer BFL is disposed, and the buffer layer BFL may be an inorganic layer. On the buffer layer BFL, a semiconductor pattern may be disposed. The semiconductor pattern may include polysilicon (p-Si). However, the present inventive concept is not limited thereto. For example, the semiconductor pattern may include amorphous silicon (a-Si), or a metal oxide. The metal oxide may include an oxide of at least one material selected from, for example, indium (In), gallium (Ga), stannum (Sn), zirconium (Zr), vanadium (V), hafnium (Hf), cadmium (Cd), germanium (Ge), chromium (Cr), titanium (Ti), and zinc (Zn).

Depending on whether doped or not, the electrical properties of the semiconductor pattern may vary. The semiconductor pattern may include a doped region and a non-doped region. The doped region may be doped with an N-type dopant or a P-type dopant. For example, the N-type dopant may include, for example, phosphorus (P), arsenic (As), or antimony (Sb), and the P-type dopant may include, for example, aluminum (Al), boron (B), or indium (In). The doped region has higher conductivity than the non-doped region, and may substantially serve as a source electrode and a drain electrode of the transistor TR. The non-doped region may substantially correspond to an active region (or a channel region) of a transistor.

A source region S, an active region A, and a drain region D of the transistor TR may be formed from the semiconductor pattern. On the semiconductor pattern, a first insulating layer INS1 may be disposed. On the first insulating layer INS1, a gate electrode G of the transistor TR may be disposed. On the gate electrode G, a second insulating layer INS2 may be disposed. On the second insulating layer INS2, a third insulating layer INS3 may be disposed.

A connection electrode CNE may be disposed between the transistor TR and the light emitting element OLED to connect the transistor TR and the light emitting element OLED. The connection electrode CNE may include a first connection electrode CNE1 and a second connection electrode CNE2.

The first connection electrode CNE1 is disposed on the third insulating layer INS3, and may be connected to the drain region D through a first contact hole CH1 defined in the first to third insulating layers INS1 to INS3. A fourth insulating layer INS4 may be disposed on the first connection electrode CNE1. On the fourth insulating layer INS4, a fifth insulating layer INS5 may be disposed. The second connection electrode CNE2 may be disposed on the fifth insulating layer INS5. The second connection electrode CNE2 may be connected to the first connection electrode CNE1 through a second contact hole CH2 defined in the fourth and fifth insulating layers INS4 and INS5.

On the second connection electrode CNE2, a sixth insulating layer INS6 may be disposed. Layers from the buffer layer BFL to the sixth insulating layer INS6 may be defined as the circuit element layer DP-CL. The first insulating layer INS1 to the sixth insulating layer INS6 may be an inorganic layer or an organic layer. In an exemplary embodiment of the present inventive concept, the first insulating layer INS1 to the sixth insulating layer INS6 may each include an inorganic insulating layer such as, for example, silicon oxide ($SiO_2$), silicon nitride ($Si_3N_4$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$), or may include an organic insulating material such as, for example, polyimide, polyamide, acrylic resin, benzocyclobutene, hexamethyldisiloxane (HMDSO), or phenolic resin.

On the sixth insulating layer INS6, the first electrode AE may be disposed. The first electrode AE may be connected to the second connection electrode CNE2 through a third contact hole CH3 defined in the sixth insulating layer INS6. On the first electrode AE and the sixth insulating layer INS6, a pixel definition film PDL, which exposes a predetermined portion of the first electrode AE, may be disposed. On the pixel definition film PDL, an opening PX_OP for exposing the predetermined portion of the first electrode AE may be defined.

The hole control layer HCL may be disposed on the first electrode AE and the pixel definition film PDL. The hole control layer HCL may be commonly disposed in the light emitting region PA and the non-light emitting region NPA, and may include a hole transport layer and a hole injection layer.

The light emitting layer EML may be disposed on the hole control HCL. The light emitting layer EML may be disposed in a region corresponding to the opening PX_OP, and may include an organic material and/or an inorganic material. In an exemplary embodiment of the present inventive concept, the light emitting layer EML may include a fluorescent material or a phosphorescent material. The light emitting layer EML may generate first light. The first light may be blue light.

The electron control layer ECL may be disposed on the light emitting layer EML and the hole control layer HCL. The electron control layer ECL may be commonly disposed in the light emitting region PA and the non-light emitting region NPA, and may include an electron transport layer and an electron injection layer.

The second electrode CE may be disposed on the electron control layer ECL, and may be commonly disposed in the pixels PX. A layer in which the light emitting element OLED is disposed may be defined as the display element layer DP-OLED. For example, layers from the first electrode AE to the first encapsulation layer EN1 may be defined as the display element layer DP-OLED.

The thin film encapsulation layer TFE may be disposed on the second electrode CE to cover the pixel PX. The thin film encapsulation layer TFE may include a first encapsulation layer EN1 disposed on the second electrode CE, a second encapsulation layer EN2 disposed on the first encapsulation layer EN1, and a third encapsulation layer EN3 disposed on the second encapsulation layer EN2.

The first and third encapsulation layers EN1 and EN3 may be inorganic layers, and the second encapsulation layer EN2 may be an organic layer. The first and third encapsulation layers EN1 and EN3 may protect the pixel PX from moisture/oxygen. The second encapsulation layer EN2 may protect the pixel PX from foreign materials such as dust particles. In the present exemplary embodiment, each of the first encapsulation layer EN1, the second encapsulation layer EN2, and the third encapsulation layer EN3 is shown as a single layer, but the present inventive concept is not limited thereto. For example, in an exemplary embodiment of the present inventive concept, at least one of the first encapsulation layer EN1, the second encapsulation layer EN2, and the third encapsulation layer EN3 may be provided in plurality.

The first voltage may be applied to the first electrode AE through the transistor TR, and the second voltage may be applied to the second electrode CE. A hole from the first electrode AE (anode electrode) and an electron from the second electrode CE (cathode electrode) injected into the light emitting layer EML are combined to form an exciton, and when the exciton transits to a ground state, the light emitting element OLED may emit light.

Figure 6:
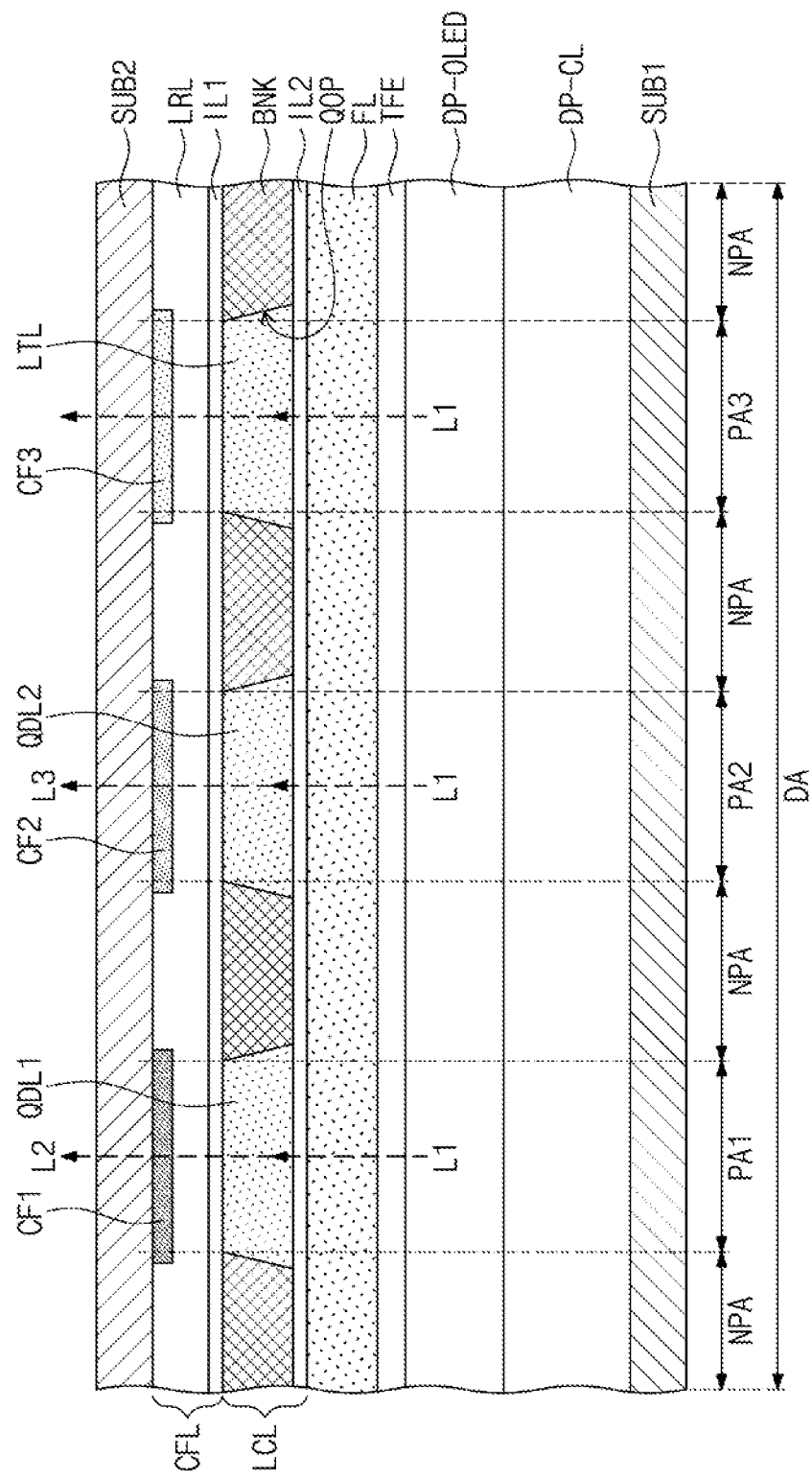
FIG. 6 is a view exemplarily illustrating a cross-section of a color filter layer and a light conversion layer illustrated in FIG. 3.

FIG. 6 is a view exemplarily illustrating a cross-section of a color filter layer and a light conversion layer illustrated in FIG. 3.

Illustratively, FIG. 6 illustrates the circuit element layer DP-CL, the display element layer DP-OLED, the thin film encapsulation layer TFE, and the filling agent FL along with the color filter layer CFL and the light conversion layer LCL. In addition, illustratively, in FIG. 6, the transistors TR disposed on the circuit element layer DP-CL and the light emitting elements OLED disposed on the display element layer DP-OLED are omitted.

Referring to FIG. 6, the display part DA may include a first light emitting region PA1, a second light emitting region PA2, and a third light emitting region PA3, and the non-light emitting region NPA disposed around each of the first, second, and third light emitting regions PA1, PA2, and PA3.

The light emitting region PA illustrated in FIG. 5 may be any one among the first, second, and third light emitting regions PA1, PA2, and PA3. The first, second, and third light emitting regions PA1, PA2, and PA3 may generate first light L1. Illustratively, the first light L1 may be blue light.

The color filter layer CFL may include a first color filter CF1, a second color filter CF2, a third color filter CF3, a low refraction layer LRL, and a first insulation layer IL1. Illustratively, although one of each of the first color filter CF1, the second color filter CF2, and the third color filter CF3 are illustrated, substantially, the first color filter CF1, the second color filter CF2, and/or the third color filter CF3 may be provided in plurality.

In an exemplary embodiment of the present inventive concept, the light conversion layer LCL may include a quantum dot. The quantum dot is a particle having a crystal structure of several to tens of nanometers in size, and may include hundreds to thousands of atoms. The quantum dot fluorescent material or a phosphorescent material when used in a display device can produce pure monochromatic red, green, and blue light. Light of a desired wavelength range may be obtained by controlling the composition of the quantum dot, for example, controlling band gap of the quantum dot. On the other hand, even quantum dot that includes the same material may emit different wavelengths according to its particle size. Thus, the quantum dot may control color of emitted light according to the particle size.

The light conversion layer LCL may include a first quantum dot layer QDL1, a second quantum dot layer QDL2, a light transmission layer LTL, a bank layer BNK, and a second insulation layer IL2. Illustratively, although one of each of the first quantum dot layer QDL1, the second quantum dot layer QDL2, and the light transmission layer LTL are illustrated, substantially, the first quantum dot layer QDL1, the second quantum dot layer QDL2, and/or the light transmission layer LTL may be provided in plurality.

The first color filter CF1, the second color filter CF2, and the third color filter CF3 may be disposed below the second substrate SUB2. When viewed on a plane, the first color filter CF1 may overlap the first light emitting region PA1, the second color filter CF2 may overlap the second light emitting region PA2, and the third color filter CF3 may overlap the third light emitting region PA3. The first color filter CF1 may include a red color filter for transmitting light of a red wavelength region. The second color filter CF2 may include a green color filter for transmitting light of a green wavelength region. The third color filter CF3 may include a blue color filter for transmitting light of a blue wavelength region.

The low refraction layer LRL may be disposed below the second substrate SUB2 to cover the first, second, and third color filters CF1, CF2, and CF3, and may have a smaller refractive index than the first quantum dot layer QDL1, the second quantum dot layer QDL2, and the light transmission layer LTL. The low refraction layer LRL may include an organic layer and a plurality of scattering particles which may be disposed in the organic layer to scatter light. The first insulation layer IL1 may be disposed below the low refraction layer LRL, and may be an inorganic layer.

The bank layer BNK may be disposed below the first insulation layer IL1. When viewed on a plane, the bank layer BNK may overlap the non-light emitting region NPA. On the bank layer BNK, openings QOP overlapping the first, second, and third light emitting regions PA1, PA2, and PA3 may be defined. The bank layer BNK may have a black color.

In the openings QOP, the first and second quantum dot layers QDL1 and QDL2 and the light transmission layer LTL may be disposed. Therefore, the first and second quantum dot layers QDL1 and QDL2 and the light transmission layer LTL may overlap, when viewed on a plane, the first, second, and third light emitting regions PA1, PA2, and PA3, respectively. For example, the first quantum dot layer QDL1 may overlap the first light emitting region PA1, the second quantum dot layer QDL2 may overlap the second light emitting region PA2, and the light transmission layer LTL may overlap the third light emitting region PA3.

The second insulation layer IL2 may be disposed below the bank layer BNK, the first and second quantum dot layers QDL1 and QDL2, and the light transmission layer LTL. The second insulation layer IL2 may be an inorganic layer.

The first light L1 generated in the first, second, and third light emitting regions PA1, PA2, and PA3 may be provided to the first and second quantum dot layers QDL1 and QDL2 and the light transmission layer LTL, respectively. For example, the first light L1 generated in the first light emitting region PA1 may be provided to the first quantum dot layer QDL1, and the first light L1 generated in the second light emitting region PA2 may be provided to the second quantum dot layer QDL2. The first light L1 generated in the third light emitting region PA3 may be provided to the light transmission layer LTL.

The first quantum dot layer QDL1 may convert the first light L1 into a second light L2. The second quantum dot layer QDL2 may convert the first light L1 into a third light L3. Illustratively, the second light L2 may be red light, and the third light L3 may be green light. The first quantum dot layer QDL1 may include first quantum dots, and the second quantum dot layer QDL2 may include second quantum dots. The light transmission layer LTL may include light scattering particles.

The first quantum dots may convert the first light L1 having a blue color wavelength band into the second light L2 having a red wavelength band. The second quantum dots may convert the first light L1 having a blue color wavelength band into the third light L3 having a green wavelength band.

The first and second quantum dots may scatter the second and third lights L2 and L3. In an exemplary embodiment of the present inventive concept, the first and second quantum dots may each have a full width of half maximum (FWHM) of a spectrum of an emission wavelength of about 45 nm or less, about 40 nm or less, or about 30 nm or less. When the FWHM of each of the first and second quantum dots is within this range, color purity or color reproducibility may be enhanced. In addition, since light emitted through each of the first and second quantum dots is emitted in all directions, an optical viewing angle may be enhanced.

The light transmission layer LTL may transmit the first light L1 without performing a light conversion operation. The first light L1 may be scattered by the light scattering particles of the light transmission layer LTL and be emitted. In this case, compared to amounts of light emitted through first quantum dot layer QDL1 and the second quantum dot layer QDL2, which are color converted, the amount of light emitted through the light transmission layer LTL that is not color converted may be greater. A light scattering particle may be included in at least one of the first and second quantum dot layers QDL1 and QDL1.

The first quantum dot layer QDL1 may emit the second light L2, the second quantum dot layer QDL2 may emit the third light L3, and the light transmission layer LTL may emit the first light L1. Therefore, a predetermined image may be displayed by the second light L2, the third light L3, and the first light L1 respectively displaying red, green, and blue colors.

The first, second, and third lights L1, L2, and L3 may be provided to a user by being transmitted through the first, second, and third color filters CF1, CF2, and CF3 and the second substrate SUB2. The first, second, and third lights L1, L2, and L3 are refracted in the low refraction layer LLR, and then may be emitted by being further scattered by the scattering particles disposed in the low refraction layer LRL.

A portion of the first light L1 may be provided to the first color filter CF1 by being transmitted through the first quantum dot layer QDL1 without being subjected to light conversion by the first quantum dots. That is, the first light L1 not in contact with the first quantum dots, and thus, not converted into the second light L2 may be present. The first color filter CF1 may block light of a different color. For example, the first color filter CF1 may block light which is not within the red wavelength region. The first light L1 not converted in the first quantum dot layer QDL1 may not be emitted to an upper portion by being blocked in the first color filter CF1 having the red color filter.

A portion of the first light L1 may be provided to the second color filter CF2 by being transmitted the second quantum dot layer QDL2 without being subjected to light conversion by the second quantum dots. That is, the first light L1 not in contact with the second quantum dots, and thus, not converted into the third light L3 may be present. The second color filter CF2 may block light of a different color. For example, the second color filter CF2 may block light which is not within the green wavelength region. The first light L1 not converted in the second quantum dot layer QDL2 may not be emitted to an upper portion by being blocked in the second color filter CF2 having the green color filter.

External light may be provided to the display panel DP above the display device DD. The external light may be white light. The white light may include red light, green light, and blue light. When the first, second, and third color filters CF1, CF2, and CF3 are not used, the external light may be provided as it is to an external user after being reflected by metal layers (for example, wirings) disposed inside the display panel DP. In this case, such as light reflected from a mirror, the external light may be visible to the user.

The first, second, and third color filters CF1, CF2, and CF3 may prevent the reflection of the external light. For example, the first, second, and third color filters CF1, CF2, and CF3 may filter the external light to red, green, and blue colors, respectively.

Green light and blue light of the external light provided to the first color filter CF1 may be blocked in the first color filter CF1 including the red color filter. Therefore, the external light provided to the first color filter CF1 may be filtered to red light which is the same as light emitted from the first quantum dot layer QDL1 by the first color filter CF1. Thus, the external light reflected by the metal layers may be indistinguishable from the light emitted from the first quantum dot layer QDL1 and accordingly may not be visible to the user.

Red light and blue light of the external light provided to the second color filter CF2 may be blocked in the second color filter CF2 which is the green color filter. Therefore, the external light provided to the second color filter CF2 may be filtered to green light which is the same as light emitted from the second quantum dot layer QDL2 by the second color filter CF2. Thus, the external light reflected by the metal layers may be indistinguishable from the light emitted from the second quantum dot layer QDL2, and accordingly may not be visible to the user.

Red light and green light of the external light provided to the third color filter CF3 may be blocked in the third color filter CF3 which is the blue color filter. Therefore, the external light provided to the third color filter CF3 may be filtered to blue light which is the same as light emitted from the light transmission layer LTL by the third color filter CF3. Thus, the external light reflected by the metal layers may be indistinguishable from the light emitted from the light transmission layer LTL, and accordingly may not be visible to the user. Therefore, the external light is blocked in the first, second, and third color filters CF1, CF2, and CF3, so that the reflection of the external light may be reduced.

The bank layer BNK which has a black color may block unnecessary light in the non-light emitting region NPA. In an exemplary embodiment of the present inventive concept, the bank layer BNK may include a metal film, or may include an inorganic film or an organic resin film including a black dye or a black pigment. For example, the bank layer BNK may prevent the color mixing of the first, second, and third lights L1, L2, and L3.

Figure 7:
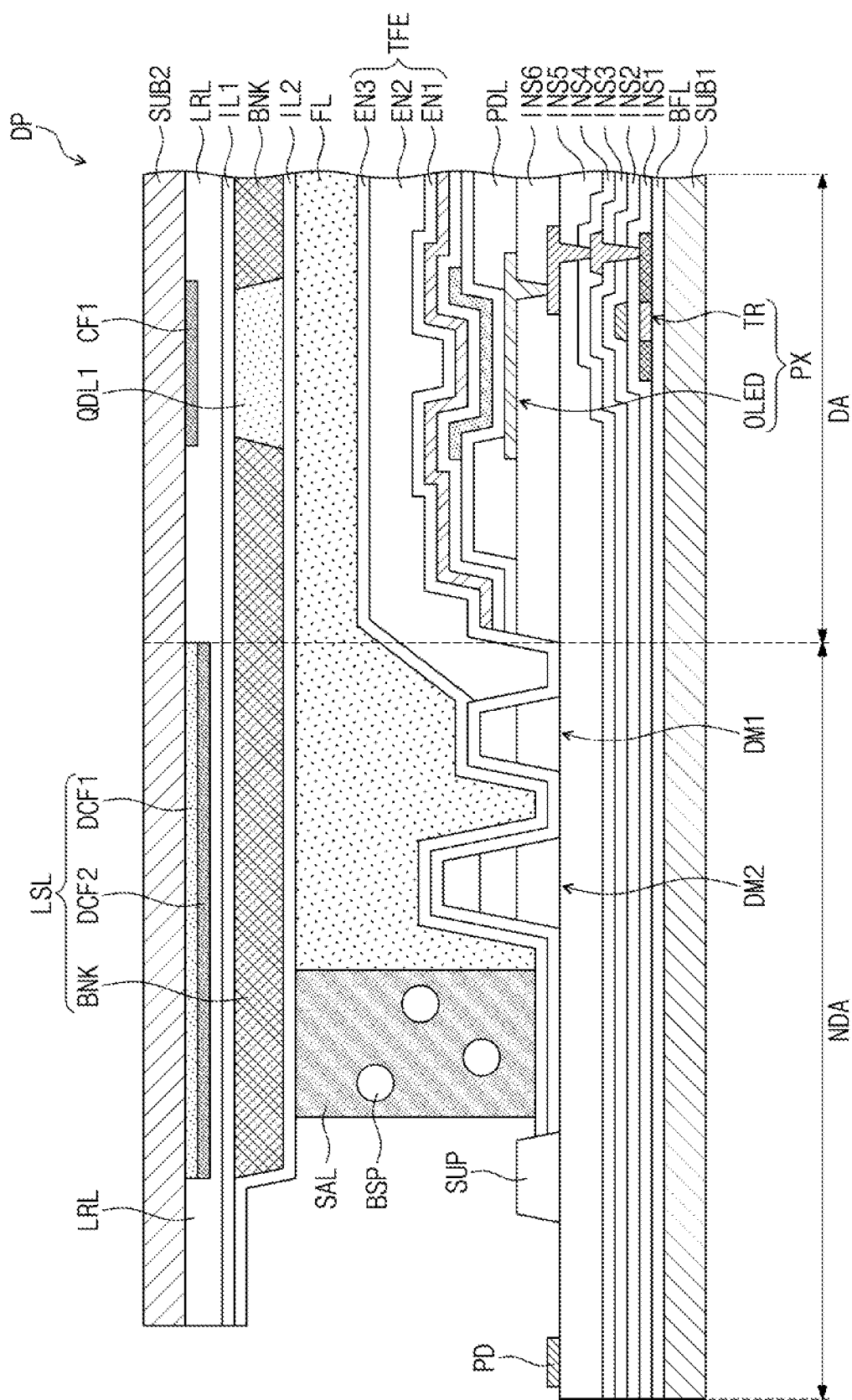
FIG. 7 is a view illustrating a cross-section of the display panel overlapping a portion of a non-display part and a display part adjacent to the non-display part illustrated in FIG. 3.

FIG. 7 is a view illustrating a cross-section of the display panel overlapping a portion of a non-display part and a display part adjacent to the non-display part illustrated in FIG. 3.

FIG. 7 exemplarily illustrates the pixel PX adjacent to the non-display part NDA, the first color filter CF1, and the first quantum dot layer QDL1. However, the present inventive concept is not limited thereto. For example, on the display part DA adjacent to the non-display part NDA, the second color filter CF2 and the second quantum dot layer QDL2 may be disposed, or the third color filter CF3 and the light transmission layer LTL may be disposed.

Referring to FIG. 7, the buffer layer BFL disposed on the display part DA of the first substrate SUB1 and the first to fifth insulating layers INS1 to INS5 may be extended onto the non-display part NDA of the first substrate SUB1. The sixth insulating layer INS6 and the pixel definition film PDL may be disposed on the display part DA. The pad PD may be disposed on the fifth insulating layer INS5. When viewed on a plane, the second substrate SUB2 may not overlap the pad PD. For example, the pad PAD may be located at a side of the first substrate SUB1 on the non-display part NDA. The pad PAD is exposed and not covered by any insulating layer, and may be connected to the flexible printed circuit board FPCB.

The pixel PX is disposed between the display part DA and the second substrate SUB2, and the first quantum dot layer QDL1 may be disposed between the second substrate SUB2 and the pixel PX. The first color filter CF1 may be disposed between the second substrate SUB2 and the first quantum dot layer QDL1.

The display panel DP may include a plurality of dams DM1 and DM2 disposed on the non-display part NDA and a support layer SUP which is also disposed on the non-display part NDA. The dams DM1 and DM2 and the support layer SUP are disposed on the fifth insulating layer INS5 and may be spaced apart from each other. The dams DM1 and DM2 may include a first dam DM1 and a second dam DM2 spaced apart from each other. The first dam DM1 may be more adjacent to the display part DA than the second dam DM2. For example, the first dam DM1 may be disposed between the second dam DM2 and the display part DA. The support layer SUP may be more adjacent to an edge of the first substrate SUB1 than the first and second dams DM1 and DM2. For example, the support layer SUP may be disposed between the second dam DM2 and the edge of the first substrate SUB1. The first dam DM1 may be spaced apart from the second dam DM2 on the non-display part NDA, with the first and second dams DM1 and DM2 each surrounding the display part DA.

Each of the first dam DM1 and the second dam DM2 may include a plurality of layers stacked on each other. For example, the first dam DM1 may include two layers and the second dam may include three layers. However, the layers constituting the first and second dams DM1 and DM2 are not limited thereto and the number of layers and the material of layers may be changed. Illustratively, the height of the second dam DM2 may be greater than the height of the first dam DM1, but the height of the second dam DM2 and the height of the first dam DM1 are not limited thereto.

The thin film encapsulation layer TFE disposed on the display part DA so as to cover the pixel PX may extend toward the non-display part NDA to overlap the non-display part NDA. The thin film encapsulation layer TFE may be disposed on the fifth insulating layer INS5 to cover the first and second dams DM1 and DM2. The thin film encapsulation layer TFE may be adjacent to the support layer SUP, and may come in contact with a side surface of the support layer SUP facing the first and second dams DM1 and DM2. However, the present inventive concept is not limited thereto. For example, the thin film encapsulation layer TFE may be spaced apart from the side surface of the support layer SUP.

The first encapsulation layer EN1 disposed on the pixel PX may extend toward the non-display part NDA to overlap the non-display part NDA. The first encapsulation layer EN1 disposed on the non-display part NDA may be disposed on the fifth insulating layer INS5 and the first and second dams DM1 and DM2. For example, the first encapsulation layer EN1 may be disposed on the fifth insulating layer INS5 to cover the first and second dams DM1 and DM2.

When viewed on a plane, the second encapsulation layer EN2 may be disposed on the first encapsulation layer EN1 by overlapping the display part DA. The first and second dams DM1 and DM2 may partition a formation region of the second encapsulation layer EN2 including an organic material. The organic material having fluidity may be cured to form the second encapsulation layer EN2. Even when the organic material having fluidity flows toward the non-display part NDA, the organic material may be blocked by the first dam DM1. Therefore, the second encapsulation layer EN2 may be disposed up to the first dam DM1. The second dam DM2 may further block the organic material overflowing the first dam DM1. For example, the second dam DM2 may be higher than the first dam DM1. Since a height of the second dam DM2 is higher than a height of the first dam DM1, the second encapsulation layer EN2 may be prevented from flooding over the second dam DM2 to generate an edge tail.

The third encapsulation layer EN3 may be disposed on the first encapsulation layer EN1 to cover the second encapsulation layer EN2. The first encapsulation layer EN1 and the third encapsulation layer EN3 may contact each other on the non-display part NDA to be adjacent to the support layer SUP. The first encapsulation layer EN1 may directly contact the third encapsulation layer EN3 outside the second dam DM2 to prevent external moisture or impurities from propagating into the display device through the second encapsulation layer EN2 which is an organic material. The first encapsulation layer EN1 and the third encapsulation layer EN3 in contact with each other may contact the side surface of the support layer SUP, but the present inventive concept is not limited thereto. For example, the first encapsulation layer EN1 and the third encapsulation layer EN3 may be spaced apart from the side surface of the support layer SUP.

The bank layer BNK disposed around the first quantum dot layer QDL1 may extend toward an edge of the second substrate SUB2, and may be disposed below the second substrate SUB2. Therefore, when viewed on a plane, the bank layer BNK may overlap the non-display part NDA.

The display panel DP may include a plurality of dummy color filters DCF1 and DCF2 stacked on each other having different colors. The light blocking layer LSL may include the bank layer BNK overlapping the dummy color filters DCF1 and DCF2 and the non-display part NDA. For example, the bank layer BNK and the dummy color filters DCF1 and DCF2 may constitute the light blocking layer LSL over the non-display part NDA of the first substrate SUB1.

The dummy color filters DCF1 and DCF2 may be disposed between the bank layer BNK and the second substrate SUB2, and may overlap the non-display part NDA when viewed on a plane. The dummy color filters DCF1 and DCF2 may include a first dummy color filter DCF1 disposed below the second substrate SUB2 and a second dummy color filter disposed below the first dummy color filter DCF2.

Illustratively, two dummy color filters DCF1 and DCF2 are illustrated, but the number of dummy color filters is not limited thereto. Illustratively, the first dummy color filter DCF1 may include a blue color filter which is the same as the third color filter CF3. In addition, the second dummy color filter DCF2 may include a red color filter which is the same as the first color filter CF1. The first and second dummy color filters DCF1 and DCF2 may have a function for preventing external light reflection similar to that of the first and third color filters CF1 and CF3. In an exemplary embodiment of the present inventive concept, in addition to the first and second dummy color filters DCF1 and DCF2, a third dummy color filter having a function for preventing external light reflection similar to that of the second color filter CF2 may also be disposed between the bank layer BNK and the second substrate SUB2.

The low refraction layer LRL extends toward the edge of the second substrate SUB2, and when viewed on a plane, may overlap the non-display part NDA. The low refraction layer LRL may be disposed below the second substrate SUB2 to cover the first and second dummy color filters DCF1, and DCF2.

The first insulation layer IL1 may extend toward the edge of the second substrate SUB2, and may be disposed below the low refraction layer LRL. The second insulation layer IL2 may extend toward the edge of the second substrate SUB2, and may be disposed below the bank layer BNK. The low refraction layer LRL, the first insulation layer IL1 and the second insulation layer IL2 may extend up to the edge of the second substrate SUB2.

The sealant SAL may be disposed between the non-display part NDA and the bank layer BNK. For example, the sealant SAL may be disposed between the second insulation layer IL2 and the non-display part NDA. In the sealant SAL, a plurality of ball spacers BSP for enhancing the support force of the sealant SAL may be disposed. The ball spacer BSP may include an organic material or an inorganic material.

The sealant SAL may be disposed on the thin film encapsulation layer TFE. For example, the sealant SAL may be disposed on the first and third encapsulation layers EN1 and EN3 in contact with each other. For example, the sealant SAL may overlap the first and third encapsulation layers EN1 and EN3 in the third direction DR3, and may be in direct contact with the third encapsulation layer EN3. The sealant SAL may be disposed between the second dam DM2 and the support layer SUP. The second dam DM2 may be disposed between the sealant SAL and the first dam DM1. The support layer SUP may be disposed between edge of the first substrate SUB1 and the sealant SAL.

When viewed on a plane, an edge of the bank layer BNK and edges of the first and second dummy color filters DCF1 and DCF2 adjacent to the edge of the bank layer BNK may be disposed between the edge of the second substrate SUB2 and the sealant SAL. For example, the sealant SAL may overlap the first and second dummy color filters DCF1 and DCF2 and the bank layer in the third direction DR3. The edge of the bank layer BNK and the edges of the first and second dummy color filters DCF1 and DCF2 may be more adjacent to the sealant SAL than to the edge of the second substrate SUB2. The second insulation layer IL2 may be disposed below the first insulation layer IL1 to cover the bank layer BNK. For example, the sealant SAL may be in direct contact with the second insulation layer IL2.

The filling agent FL is disposed between the pixel PX and the first quantum dot layer QDL1, and may extend toward the non-display part NDA to overlap the non-display part NDA. The filling agent FL may be disposed between the second insulation layer IL2 and the third encapsulation layer EN3, and may cover the first and second dams DM1 and DM2. The sealant SAL may contact the filling agent FL. For example, the sealant SAL may be located on the non-display part NDA, and may surround the display part DA, with the filling agent FL filling a space surrounded by the sealant SAL. The space may cover the entire display part DA and a portion of the non-display part NDA.

In one example, the sealant SAL is disposed at an outer periphery than the support layer SUP, and the first and second dummy color filters DCF1 and DCF2, the bank layer BNK, the first and second insulation layers IL1 and IL2, and the low refraction layer LRL may not be disposed between the second substrate SUB2 and the sealant SAL. Therefore, the sealant SAL may directly contact the second substrate SUB2.

When the first substrate SUB1 and the second substrate SUB2 are bonded to each other through the sealant SAL, the second substrate SUB2 may compress the sealant SAL in a downward direction by pressure provided to the second substrate SUB2. When the sealant SAL does not sufficiently support the second substrate SUB2, the sealant SAL may be contracted due to the pressure.

When the sealant SAL is contracted, a gap between the first substrate SUB1 and the second substrate SUB2 overlapping the sealant SAL may be smaller than a gap between the first substrate SUB1 and the second substrate overlapping the display part DA. Therefore, a gap between the first substrate SUB1 and the second substrate SUB2 may not be maintained to be constant.

In an exemplary embodiment of the present inventive concept, a plurality of layers such as the first and second dummy color filters DCF1 and DCF2, the bank layer BNK, the first and second insulation layers IL1 and IL2, and the low refraction layer LRL are provided below the second substrate SUB2, and the sealant SAL may be disposed below the plurality of layers. When the first substrate SUB1 and the second substrate SUB2 are bonded to each other, even when predetermined pressure is provided to the second substrate SUB2, the plurality of layers and the sealant SAL may firmly support the second substrate SUB2 together. That is, a portion of the display panel DP overlapping the sealant SAL may become more robust. Therefore, the sealant SAL may not be contracted.

Since the contraction of the sealant SAL is prevented, the difference between the gap between the first substrate SUB1 and the second substrate SUB2 overlapping the sealant SAL and the gap between the first substrate SUB1 and the second substrate overlapping the display part DA may be reduced. As a result, the gap between the first substrate SUB1 and the second substrate SUB2 may be maintained to be more constant. In addition, since the plurality of layers such as the first and second dummy color filters DCF1 and DCF2, the bank layer BNK, the first and second insulation layers IL1 and IL2, and the low refraction layer LRL provided below the second substrate SUB2 are mostly extended from a place overlapping the display part DA to a place overlapping the non-display part NDA according to an exemplary embodiment of the present inventive concept, by disposing the sealant SAL under the plurality of layers, a constant gap between the first substrate SUB1 and the second substrate SUB2 from a place overlapping the display part DA to a place overlapping the sealant SAL may be maintained even when the second substrate SUB2 is under pressure, due to the continuity of the plurality of layers providing a uniform structure.

When inorganic layers are further disposed, moisture permeation may be further prevented. Below the sealant SAL, the first and third encapsulation layers EN1 and EN3 including inorganic layers may be disposed. Therefore, moisture permeation may be further prevented by the first and third encapsulation layers EN1 and EN3.

FIG. 7 may be a cross section of the non-display part NDA in which the pad PD is disposed. A cross section of the non-display part NDA in which the pad PD is not disposed may be the same as FIG. 7. For example, a cross section of the non-display part NDA adjacent to left and right sides and an upper side of the display panel in FIG. 3 may be the same as FIG. 7.

Figure 8:
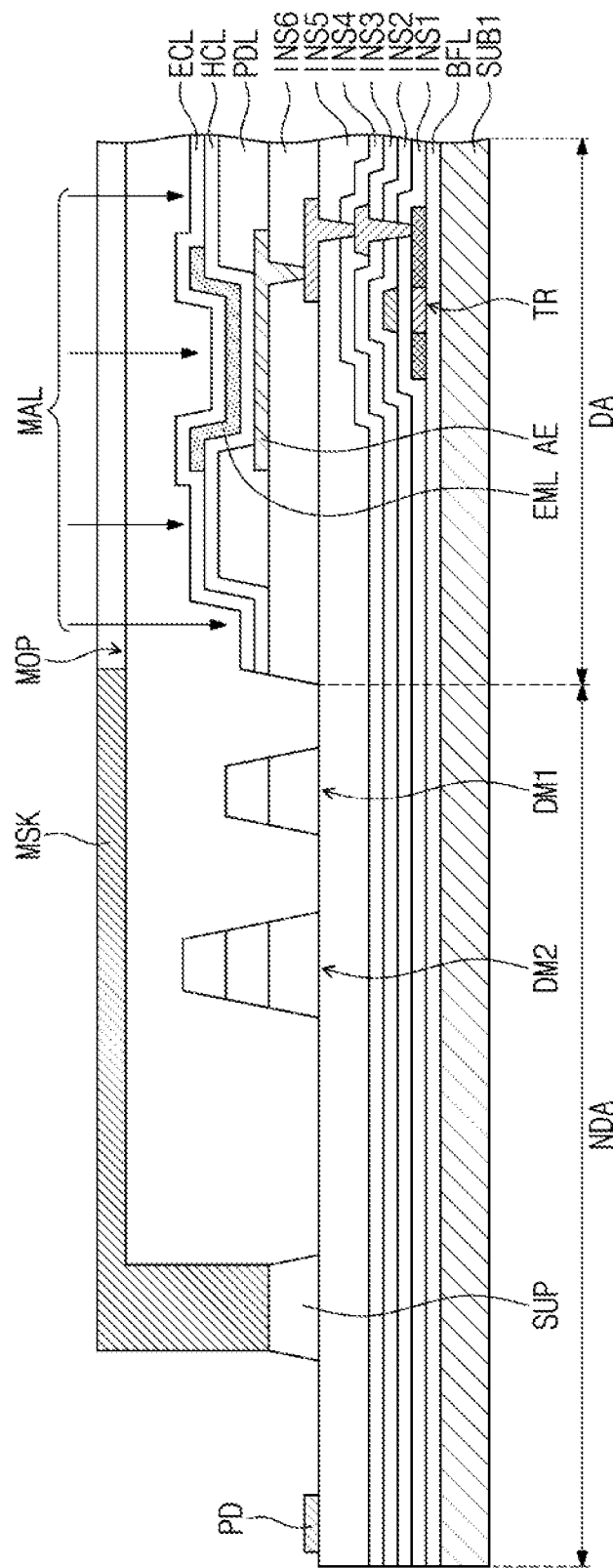
FIG. 8 is a view for illustrating the function of a support layer illustrated in FIG. 7.

FIG. 8 is a view for describing the function of a support layer illustrated in FIG. 7.

Referring to FIG. 8, a mask MSK for forming the second electrode CE of the pixel PX may be used. The mask MSK may be disposed on the support layer SUP. The support layer SUP may support the mask MSK. The support layer SUP may be formed of the same material as the sixth insulating layer INS6, and may be formed in the same process of forming the sixth insulating layer INS6, but the material of the support layer SUP is not limited thereto.

The mask MSK may be disposed on the first substrate SUB1 by being supported by the support layer SUP. In the mask MSK, an opening MOP overlapping the display part DA may be defined. A material MAL for forming the second electrode CE may be provided on the electron control layer ECL through the opening MOP. During the process of depositing the material MAL for forming the second electrode CE by using the mask MSK, the support layer SUP may maintain a separation between the mask MSK and the first substrate SUB1 having a plurality of insulating layers to prevent the second electrode CE from being chopped or torn by the mask MSK during the deposition process.

Illustratively, the mask MSK used to form the second electrode CE is described, but a mask for forming other layers of the pixel PX may be supported by the support layer SUP. For example, the mask MSK may be used to form the hole control layer HCL, the electron control layer ECL, and/or the light emitting layer EML.

Figure 9:
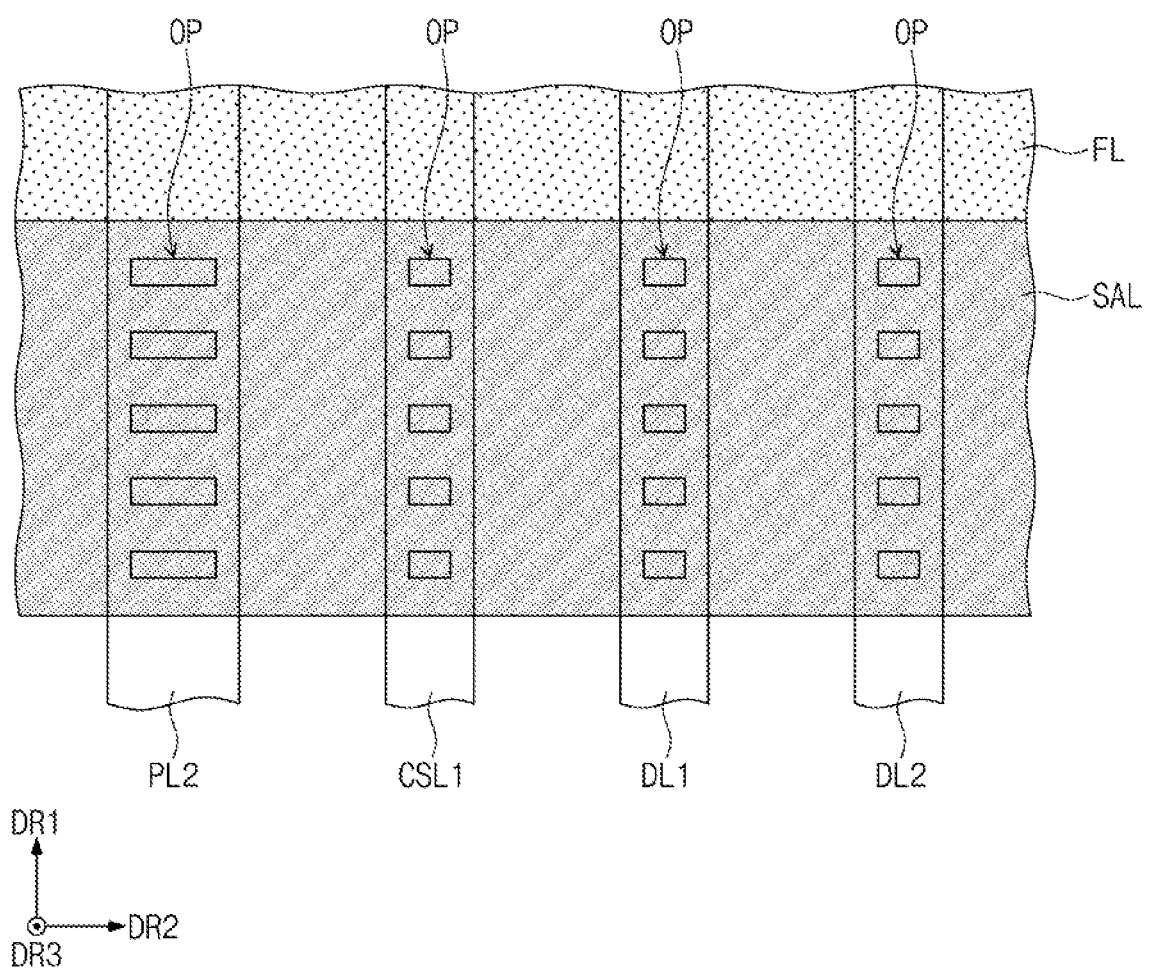
FIG. 9 is a view illustrating a second power line, a first control line, and some data lines overlapping a sealant illustrated in FIG. 4.

FIG. 9 is a view illustrating a second power line, a first control line, and some data lines overlapping a sealant illustrated in FIG. 4.

Illustratively, FIG. 9 illustrates planes of the sealant SAL, the second power line PL2, the first control line CSL1, and the data lines DL1 and DL2 viewed from the third direction DR3. Hereinafter, the second power line PL2, the first control line CSL1, and the data lines DL1 and DL2 are referred to as signal lines.

Referring to FIG. 9, the signal lines PL2, CSL1, DL1, and DL2 may be disposed on the first substrate SUB1, and may be disposed below the sealant SAL. A plurality of openings OP may be defined in some of the signal lines PL2, CSL1, DL1, and DL2 overlapping the sealant SAL. A plurality of the openings OP overlapping the sealant SAL may also be defined in signal lines such as other data lines DL3 to DLn, the first power line PL1, and the second control line CSL2.

The sealant SAL may include an ultraviolet (UV) light curable material. Referring to FIG. 7 and FIG. 9, the sealant SAL is disposed between the first substrate SUB1 and the second substrate SUB2, and then ultraviolet light for curing the sealant SAL may be irradiated from below the first substrate SUB1 toward the sealant SAL. The signal lines PL1, PL2, CSL1, CSL2, DL1 to DLn may block the ultraviolet light.

In an exemplary embodiment of the present inventive concept, the openings OP overlapping the sealant SAL are defined in the signal lines PL1, PL2, CSL1, CSL2, DL1 to DLn, so that the ultraviolet light may be further provided to the sealant SAL through the openings OP. Therefore, the sealant SAL may be more easily cured.

FIG. 10 to FIG. 14 are views illustrating cross-sections of non-display parts of display panels each according an exemplary embodiment of the present inventive concept. In each of FIG. 10 to FIG. 14, the plurality of layers including the first and second dummy color filters DCF1 and DCF2, the bank layer BNK, the first and second insulation layers IL1 and IL2, and the low refraction layer LRL are provided below the second substrate SUB2, and the sealant SAL is disposed below the plurality of layers. When the first substrate SUB1 and the second substrate SUB2 are bonded to each other, even when predetermined pressure is provided to the second substrate SUB2, the plurality of layers and the sealant SAL may firmly support the second substrate SUB2 together.

Illustratively, FIG. 10 to FIG. 14 illustrate cross sections corresponding to FIG. 7. Hereinafter, focusing on a configuration different from the configuration illustrated in FIG. 7, configurations illustrated in FIG. 10 to FIG. 14 will be described, and the same components are illustrated using the same reference numerals.

Figure 10:
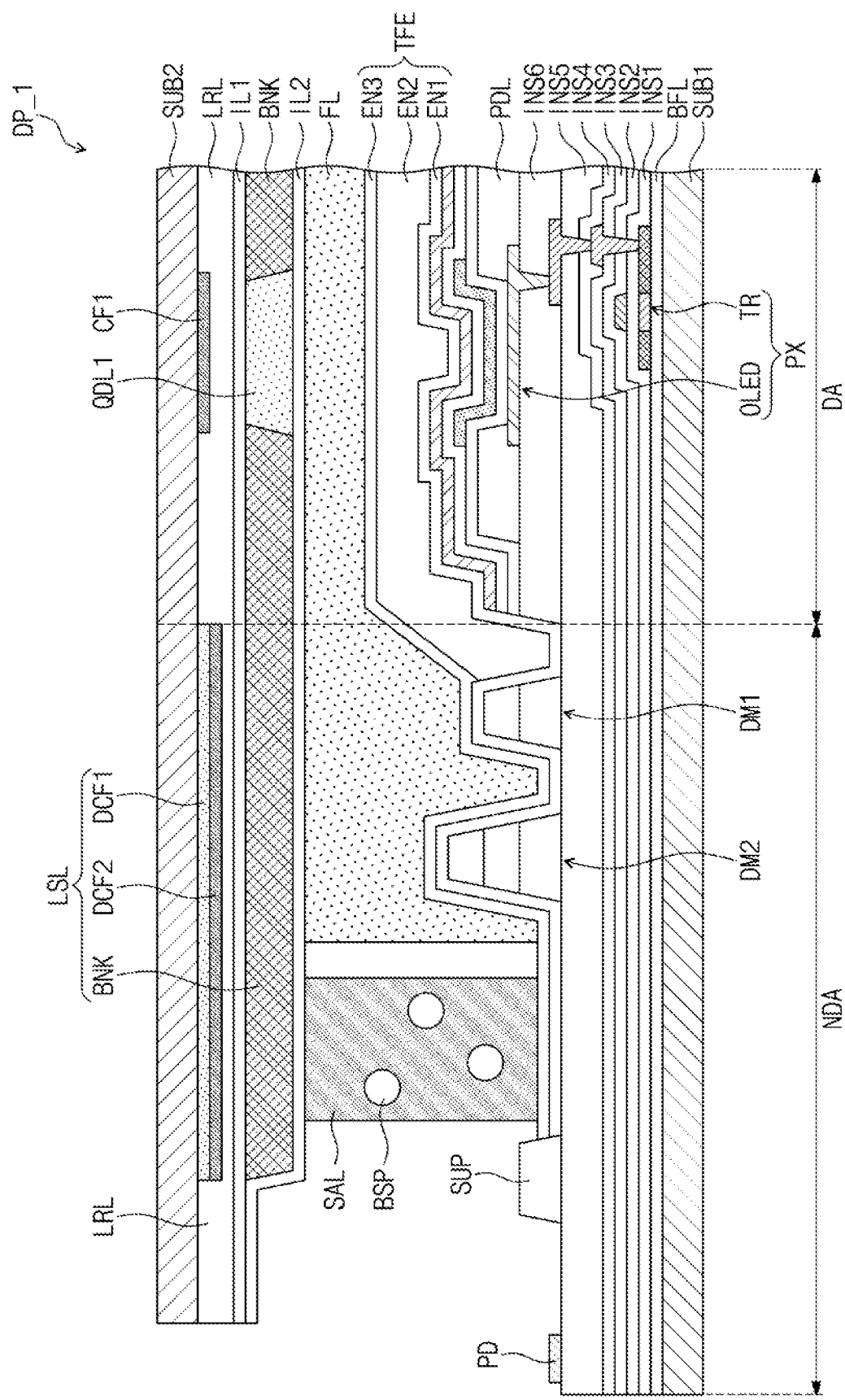
FIG. 10 to FIG. 14 are views illustrating cross-sections of non-display parts of display panels each according to an exemplary embodiment of the present inventive concept.

Referring to FIG. 10, the sealant SAL of a display panel DP_1 may be disposed between the support layer SUP and the second dam DM2, and may be formed between the second insulation layer IL2 and the third encapsulation layer EN3. The sealant SAL does not contact the filling agent FL, and may be spaced apart from the filling agent FL.

Figure 11:
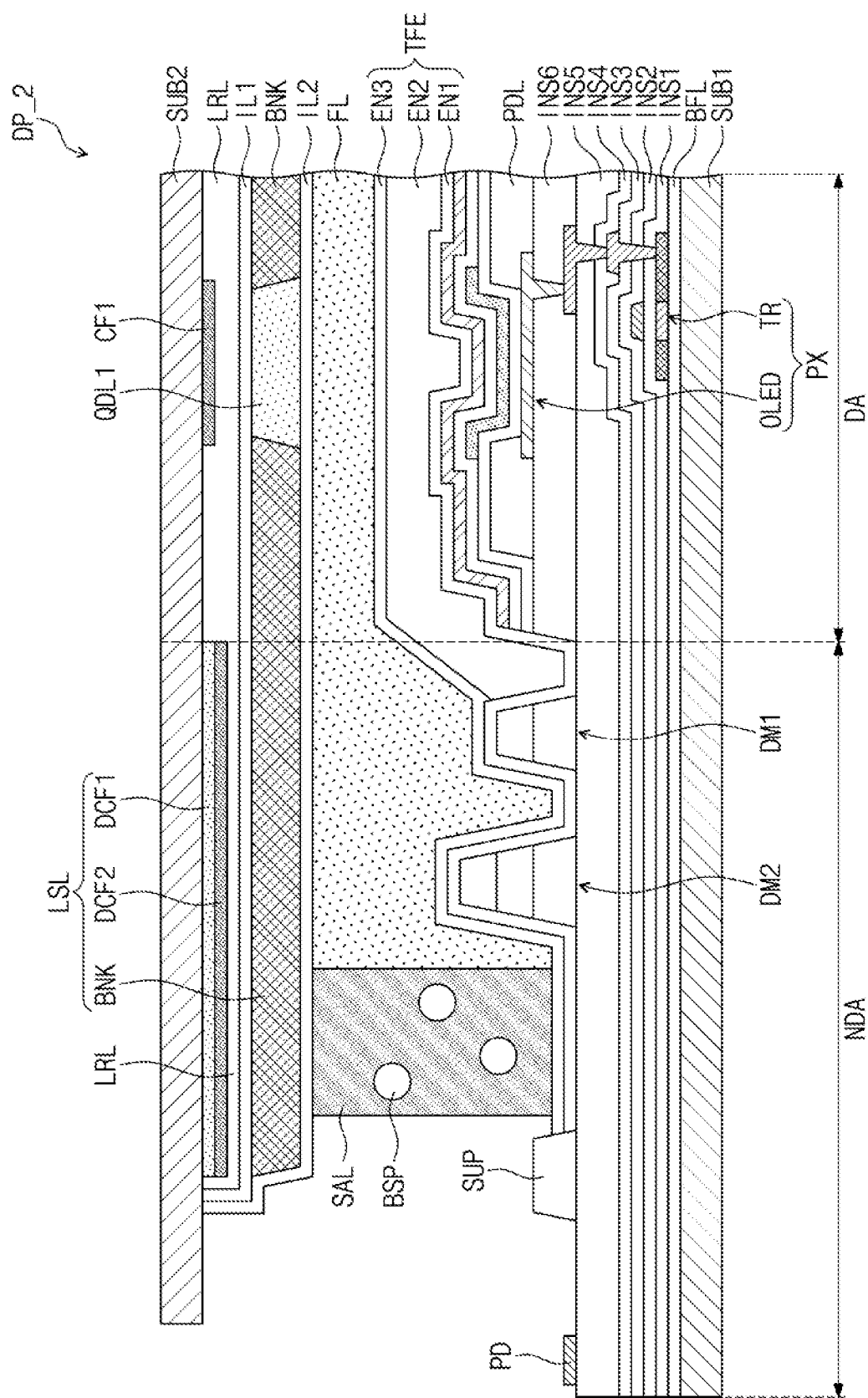

Referring to FIG. 11, when viewed on a plane, an edge of the low refraction layer LRL of a display panel DP_2 may be disposed between the edge of the second substrate SUB2 and the sealant SAL. The sealant SAL of the display panel DP_2 may be disposed between the support layer SUP and the second dam DM2, and may be formed between the second insulation layer IL2 and the third encapsulation layer EN3. The edge of the low refraction layer LRL may be more adjacent to the sealant SAL than to the edge of the second substrate SUB2.

The first insulation layer IL1 may be disposed below the second substrate SUB2 by being spaced apart from the edge of the second substrate SUB2 to cover the low refraction layer LRL. The second insulation layer IL2 may be disposed below the second substrate SUB2 by being spaced apart from the edge of the second substrate SUB2 to cover the bank layer BNK and the first insulation layer IL1.

The first insulation layer IL1 the second insulation layer IL2, and the low refraction layer LRL may not be disposed up to the edge of the second substrate SUB2. Unlike the structure illustrated in FIG. 7, the disposition area of the low refraction layer LRL may be reduced. The first and second insulation layers IL1 and IL2, which are inorganic layers, may cover the low refraction layer LRL, which is an organic layer. Therefore, external moisture, which may be injected through the low refraction layer LRL, may be blocked by the first and second insulation layers IL1 and IL2.

Figure 12:
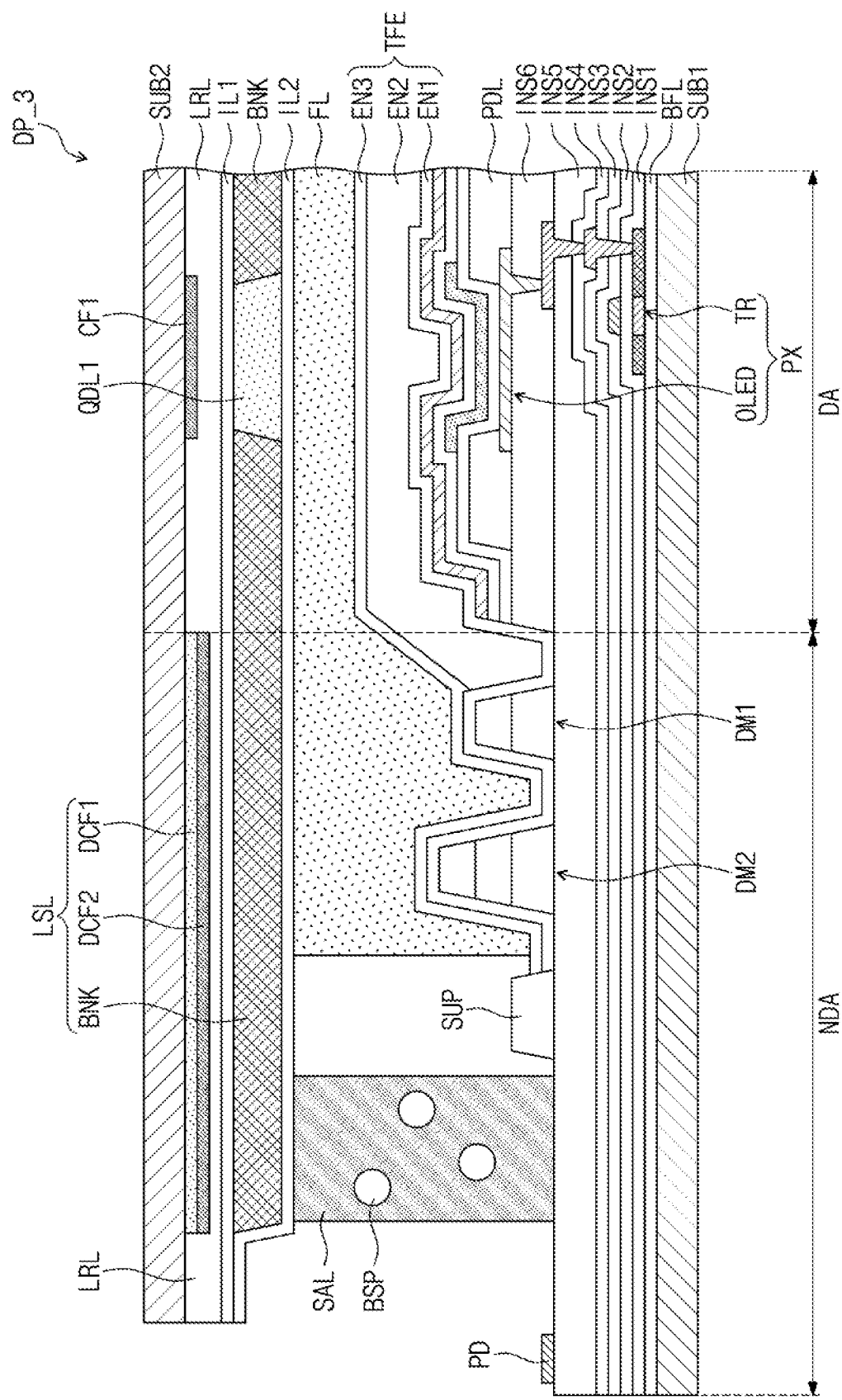

Referring to FIG. 12, the support layer SUP disposed on the non-display part NDA of a display panel DP_3 may be adjacent to the second dam DM2. The thin film encapsulation layer TFE may be adjacent to the support layer SUP.

The sealant SAL disposed on the non-display part NDA may be disposed at an outer periphery than the support layer SUP. That is, the sealant SAL may be disposed between the edge of the first substrate SUB1 and the support layer SUP. The sealant SAL may not be disposed on the thin film encapsulation layer TFE unlike the structure illustrated in FIG. 7, and may be formed between the second insulation layer IL2 and the fifth insulating layer INS5. The sealant SAL does not contact the filling agent FL, and may be spaced apart from the filling agent FL.

Figure 13:
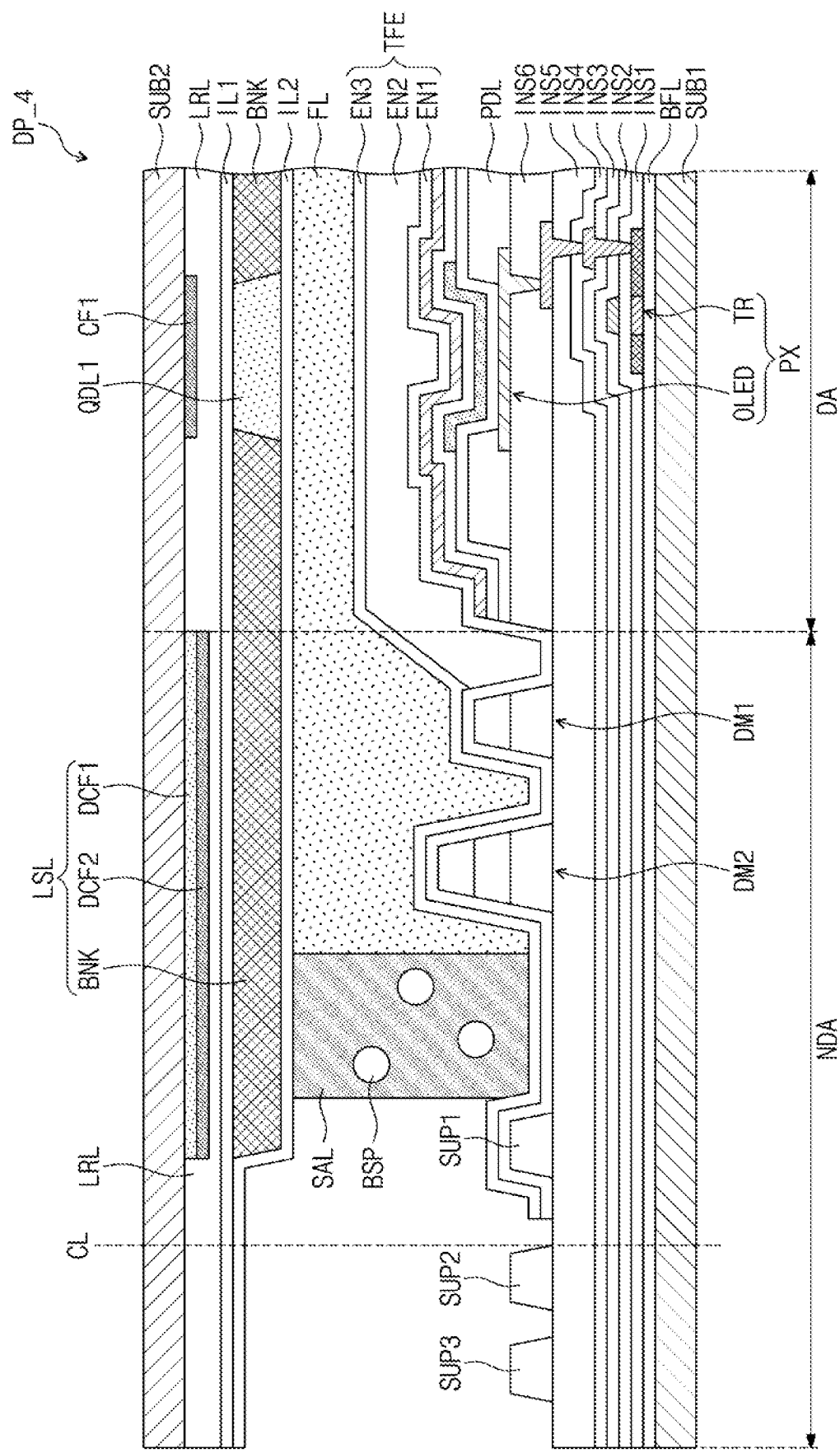

Referring to FIG. 13, a plurality of support layers SUP1, SUP2, and SUP3 may be disposed on the non-display part NDA of a display panel DP_4. The mask illustrated in FIG. 8 may be disposed on the support layers SUP1, SUP2, and SUP3. The cross section illustrated in FIG. 13 may be a cross section of the non-display part NDA of a display panel DP_4 in which the pad PD is not disposed. For example, the cross section of the display panel DP_4 illustrated in FIG. 13 may be a cross section of the non-display part NDA adjacent to left and right sides and an upper side of the display panel DP in FIG. 4.

The support layers SUP1, SUP2, and SUP3 may include a first support layer SUP1, a second support layer SUP2, and a third support layer SUP3. The first support layer SUP1 may be adjacent to the sealant SAL. The sealant SAL may be disposed on the thin film encapsulation layer TFE between the first support layer SUP1 and the display part DA. For example, the sealant SAL of the display panel DP_4 may be formed between the second insulation layer IL2 and the third encapsulation layer EN3. The third support layer SUP3 may be adjacent to the edge of the first substrate SUB1. The second support layer SUP2 may be disposed between the first support layer SUP1 and the third support layer SUP3.

The thin film encapsulation layer TFE adjacent to the first support layer SUP1 may be further disposed on the first support layer SUP1. For example, the first and third encapsulation layers EN1 and EN3 may be further deposited on the first support layer SUP1, when deposited on the first substrate SUB1. Therefore, the first and third encapsulation layers EN1 and EN3 may be disposed on the first support layer SUP1. The first and third encapsulation layers EN1 and EN3 may be disposed on the non-display part NDA to cover the first support layer SUP1. The second and third support layers SUP2 and SUP3 may be spaced apart from the first and third encapsulation layers EN1 and EN3.

Figure 14:
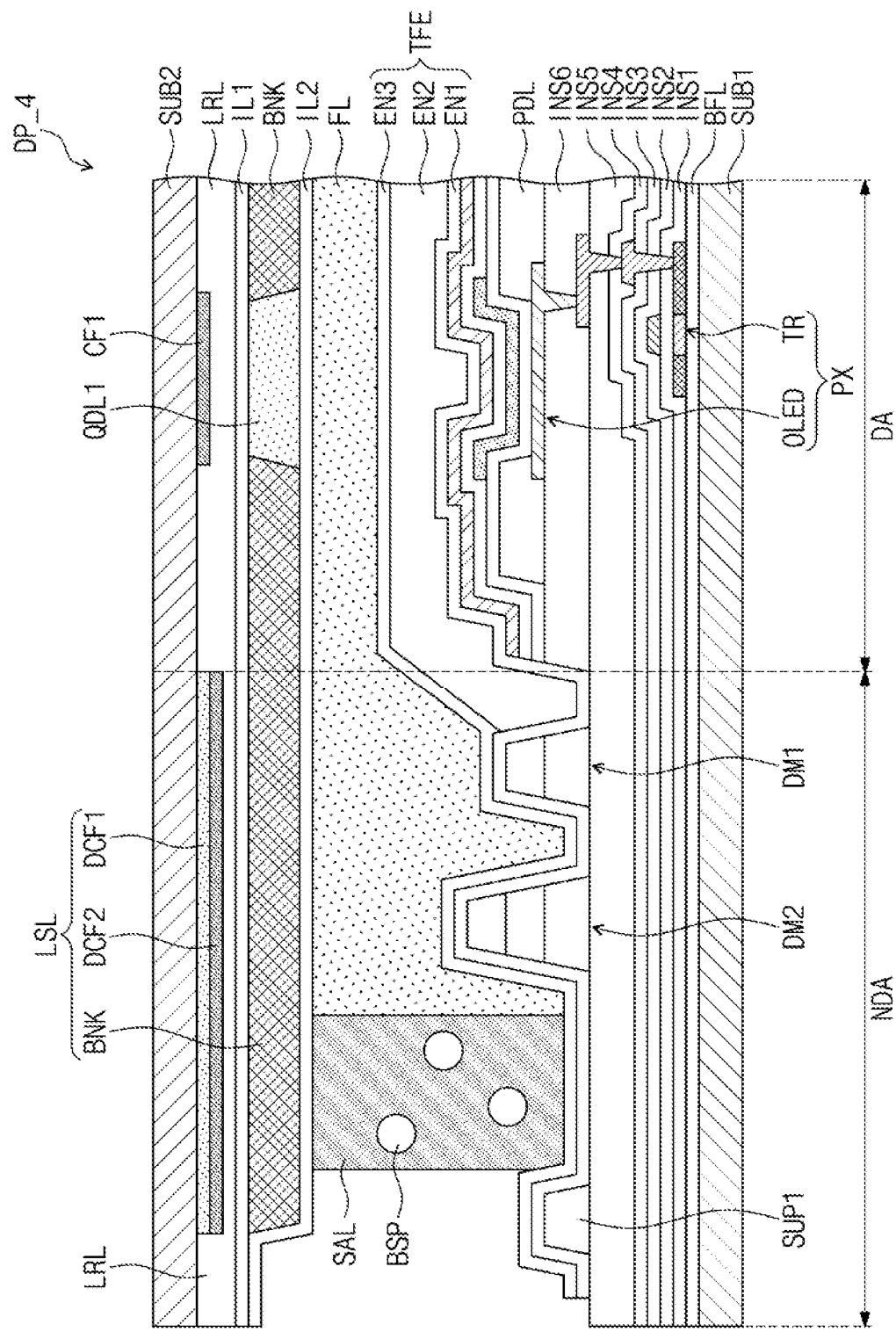

Referring to FIG. 13 and FIG. 14, the first substrate SUB1 and the second substrate SUB2 are bonded to each other by the sealant SAL, and then a portion which is adjacent to edges of the first substrate SUB1 and the second substrate SUB2 may be cut and polished. For example, the first substrate SUB1 and the second substrate SUB2 may be cut and polished along a cutting line CL overlapping an end of the second support layer SUP2 facing the first support layer SUP1. A cutting process may be first performed, and then a polishing process may be performed.

In an exemplary embodiment of the present inventive concept, a single support layer is disposed on the non-display part NDA, and the first and third encapsulation layers EN1 and EN3 may be disposed on the non-display part NDA to cover the single support layer. In this case, the cutting and polishing processes are performed on only up to a portion adjacent to the single support layer, and a polishing tool comes into contact with the first and third encapsulation layers EN1 and EN3 to damage the first and third encapsulation layers EN1 and EN3.

In an exemplary embodiment of the present inventive concept, the second support layer SUP2 may provide a reference line on which the cutting and polishing process are performed. Since the cutting and polishing process are performed along the second support layer SUP2 spaced apart from the first and third encapsulation layers EN1 and EN3, the polishing tool may not come into contact with the first and third encapsulation layers EN1 and EN3. Therefore, damage to the first and third encapsulation layers EN1 and EN3 may be prevented. For example, after polishing, an edge of the thin film encapsulation layer TFE (e.g., the first and third encapsulation layers EN1 and EN3) may be adjacent to and spaced apart from the edge of the first substrate SUB1, and may be disposed between the edge of the first substrate SUB1 and the first support layer SUP1.

Illustratively, the cutting and polishing processes are performed along the support layer SUP2, but the present inventive concept is not limited thereto. For example, the cutting and polishing processes may be performed along the third support layer SUP3.

According to an exemplary embodiment of the present inventive concept, a plurality of layers, such as dummy color filters, a low refractive layer, and a bank layer are provided below a second substrate, and a sealant is disposed below the plurality of layers, so that the gap between a first substrate and a second substrate may be maintained to be more constant.

It should be understood that the exemplary embodiments described herein should be considered in a descriptive sense only and not for purposes of limitation. Although the present inventive concept has been described with reference to the exemplary embodiments of the present inventive concept, it will be understood by those skilled in the art that various modifications and changes in form and details may be made therein without departing from the spirit and scope of the present inventive concept as defined in the appended claims.

What is claimed is:

1. A display device comprising:
   a first substrate including a display part and a non-display part around the display part;
   a second substrate disposed on the first substrate;
   a pixel disposed between the display part and the second substrate;
   a quantum dot layer, when viewed on a plane, overlapping the display part, and disposed between the second substrate and the pixel;
   a bank layer disposed around the quantum dot layer, and when viewed on the plane, overlapping the non-display part;
   a color filter disposed between the second substrate and the quantum dot layer;
   a dummy color filter, when viewed on the plane, overlapping the non-display part, and disposed between the bank layer and the second substrate; and
   a sealant disposed between the non-display part and the bank layer.

2. The display device of claim 1, further comprising a thin film encapsulation layer disposed on the display part to cover the pixel and extending toward the non-display part, and when viewed on the plane, overlapping the non-display part,
   wherein the sealant is disposed on the thin film encapsulation layer.

3. The display device of claim 2, further comprising a support layer disposed on the non-display part,
   wherein the support layer is disposed between an edge of the first substrate and the sealant, and
   the thin film encapsulation layer is adjacent to the support layer.

4. The display device of claim 3, wherein the thin film encapsulation layer comprises:
   a first encapsulation layer disposed on the pixel and extending toward the non-display part, and when viewed on the plane, overlapping the non-display part;
   a second encapsulation layer disposed on the first encapsulation layer, and when viewed on the plane, overlapping the display part; and
   a third encapsulation layer disposed on the first encapsulation layer to cover the second encapsulation layer,
   wherein the first encapsulation layer and the third encapsulation layer come into contact with each other on the non-display part to be adjacent to the support layer, and
   the sealant is disposed on the first and third encapsulation layers in contact with each other.

5. The display device of claim 3, further comprising a dam disposed on the non-display part,
   wherein the thin film encapsulation layer covers the dam, and
   the sealant is disposed between the dam and the support layer.

6. The display device of claim 1, further comprising a filling agent disposed between the pixel and the quantum dot layer, and extending toward the non-display part, and when viewed on the plane, overlapping the non-display part.

7. The display device of claim 6, wherein the sealant comes into contact with the filling agent.

8. The display device of claim 6, wherein the sealant is spaced apart from the filling agent.

9. The display device of claim 1, further comprising:
   a low refraction layer disposed below the second substrate to cover the color filter and the dummy color filter;
   a first insulation layer disposed below the low refraction layer; and
   a second insulation layer disposed below the bank layer and the quantum dot layer,
   wherein the sealant is disposed between the second insulation layer and the non-display part.

10. The display device of claim 9, wherein, when viewed on the plane, an edge of the bank layer and an edge of the dummy color filter adjacent to the edge of the bank layer are disposed between an edge of the second substrate and the sealant and are more adjacent to the sealant than to the edge of the second substrate.

11. The display device of claim 10, wherein the low refraction layer, the first insulation layer, and the second insulation layer extend to the edge of the second substrate, and
    the second insulation layer is disposed below the first insulation layer to cover the bank layer.

12. The display device of claim 10, wherein, when viewed on the plane, an edge of the low refraction layer is disposed between the edge of the second substrate and the sealant, and is more adjacent to the sealant than to the edge of the second substrate.

13. The display device of claim 12, wherein
    the first insulation layer is disposed below the second substrate, spaced apart from the edge of the second substrate, and covering the low refraction layer, and
    the second insulation layer is disposed below the second substrate, spaced apart from the edge of the second substrate, and covering the bank layer and the first insulation layer.

14. The display device of claim 1, further comprising a plurality of signal lines disposed on the first substrate and connected to the pixel,
    wherein a plurality of openings are defined in portions of the plurality of signal lines overlapping the sealant.

15. The display device of claim 1, wherein the bank layer has a black color.

16. The display device of claim 1, wherein the dummy color filter is provided in plurality, and the plurality of dummy color filters are deposited while having different colors.

17. The display device of claim 1, further comprising:
    a support layer disposed on the non-display part; and
    a thin film encapsulation layer disposed on the display part to cover the pixel and extending toward the non-display part to be adjacent to the support layer,
    wherein the sealant is disposed between an edge of the first substrate and the support layer.

18. The display device of claim 1, further comprising:

a support layer disposed on the non-display part; and a thin film encapsulation layer disposed on the display part to cover the pixel and extending toward the non-display part, and when viewed on the plane, overlapping the non-display part, wherein the thin film encapsulation layer is disposed on the support layer, and the sealant is disposed on the thin film encapsulation layer between the support layer and the display part.

19. A display device comprising:

a first substrate including a display part and a non-display part around the display part;

a second substrate disposed on the first substrate;

a pixel disposed between the display part and the second substrate;

a quantum dot layer disposed between the second substrate and the pixel;

a bank layer disposed around the quantum dot layer, and when viewed on a plane, overlapping the non-display part;

a support layer disposed on the non-display part;

a dam disposed on the non-display part and spaced apart from the support layer; and a sealant, when viewed on the plane, not overlapping the support layer, and disposed between the non-display part and the bank layer, wherein the sealant is disposed between the support layer and the dam.

20. The display device of claim 19, further comprising:

a color filter disposed between the second substrate and the quantum dot layer; and a dummy color filter, when viewed on the plane, overlapping the non-display part, and disposed between the bank layer and the second substrate.

\* \* \* \* \*